(12) United States Patent
Kuwabara et al.

(10) Patent No.: US 12,532,645 B2
(45) Date of Patent: Jan. 20, 2026

(54) ORGANIC LIGHT EMITTING ELEMENT, DISPLAY APPARATUS, PHOTOELECTRIC CONVERSION APPARATUS, ELECTRONIC DEVICE, ILLUMINATION APPARATUS, AND MOVING BODY

(71) Applicant: CANON KABUSHIKI KAISHA, Tokyo (JP)

(72) Inventors: Hideshi Kuwabara, Kanagawa (JP); Tetsuo Takahashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 515 days.

(21) Appl. No.: 17/938,597

(22) Filed: Oct. 6, 2022

(65) Prior Publication Data

US 2023/0114173 A1     Apr. 13, 2023

(30) Foreign Application Priority Data

Oct. 7, 2021  (JP) .................................. 2021-165613

(51) Int. Cl.
*H10K 59/80*        (2023.01)
(52) U.S. Cl.
CPC .................................. *H10K 59/878* (2023.02)
(58) Field of Classification Search
CPC ......... H10K 50/856; H10K 50/85–865; H10K 50/852; H10K 50/841–8428; H10K 59/17; H10K 59/80516; H10K 59/878; H10K 59/35; H10K 59/876; H10K 2102/3026; H10K 2102/351; H10H 20/814–8142; H10H 20/84; H10H 20/852–854; H10H 29/852–854; G09G 2300/0456; H05B 33/24
See application file for complete search history.

(56) References Cited

U.S. PATENT DOCUMENTS

| | | | |
|---|---|---|---|
| 2010/0219427 A1* | 9/2010 | Fukuda ................ | H10K 50/854 257/89 |
| 2020/0066808 A1* | 2/2020 | Mollard ............... | H10K 50/852 |
| 2020/0185650 A1* | 6/2020 | Lim ...................... | H10K 50/818 |
| 2020/0227685 A1 | 7/2020 | Kyoung | |
| 2021/0280832 A1* | 9/2021 | Koo ...................... | H10K 59/351 |
| 2021/0351266 A1* | 11/2021 | Kasahara .............. | H05B 45/60 |
| 2022/0020949 A1* | 1/2022 | Bae ...................... | H10K 50/856 |

FOREIGN PATENT DOCUMENTS

| | | |
|---|---|---|
| JP | 2010244694 A | 10/2010 |
| JP | 2021072282 A | 5/2021 |

* cited by examiner

*Primary Examiner* — Steven B Gauthier
*Assistant Examiner* — Adam D Weiland
(74) *Attorney, Agent, or Firm* — Canon U.S.A., Inc. IP Division

(57) ABSTRACT

An organic light emitting element includes a reflection layer, a first electrode, an organic layer including a light emitting layer, and a second electrode, arranged in this order from a side of a substrate. The reflection layer includes a first portion having a first thickness and a second portion having a second thickness smaller than the first thickness. The first electrode overlaps with the second portion, and at least part of an edge of the first electrode overlaps with the second portion in a planar view with respect to the substrate.

16 Claims, 21 Drawing Sheets

FIG.4A
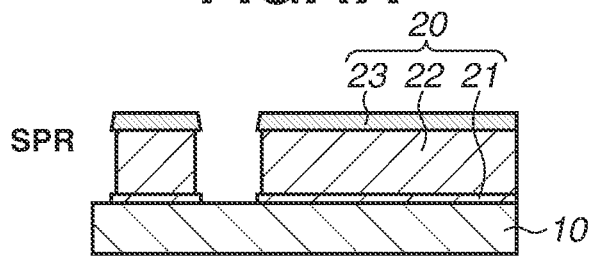
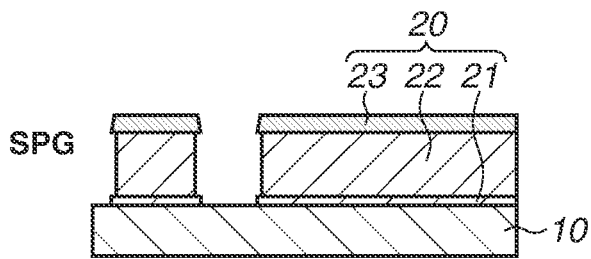
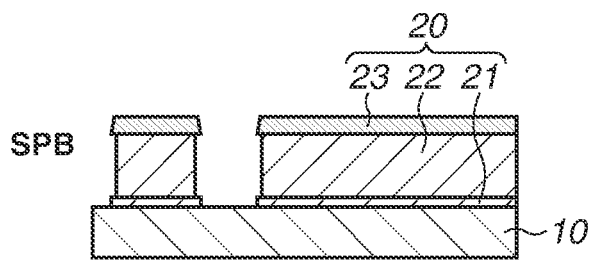
FIG.4B
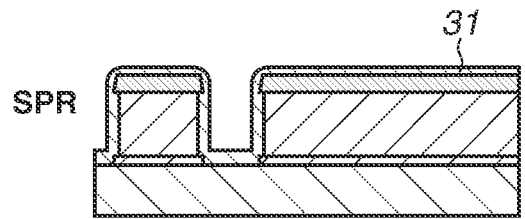
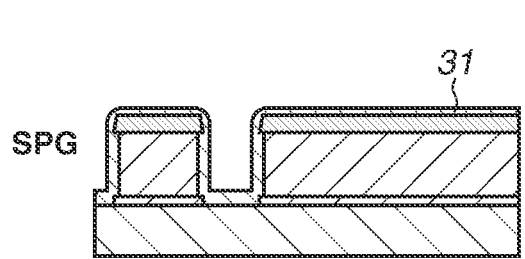
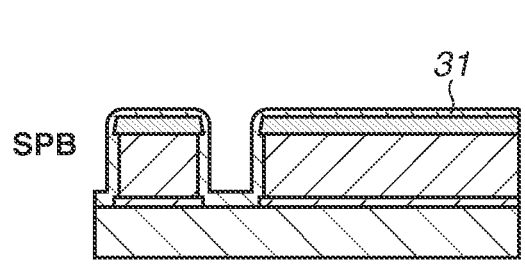
FIG.4C
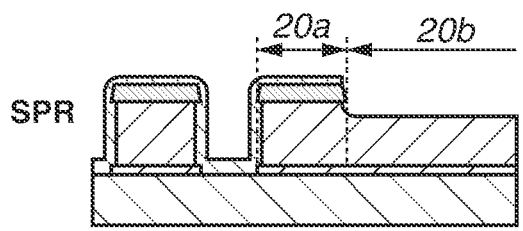
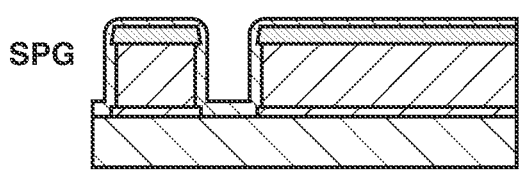
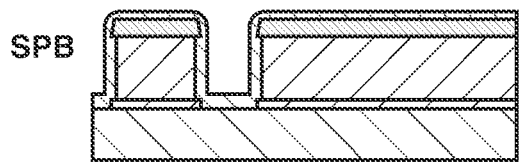
FIG.4D
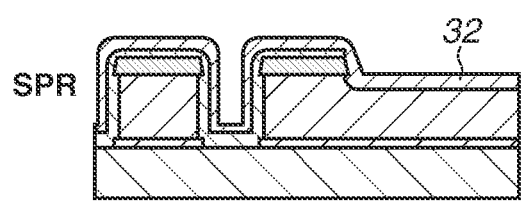
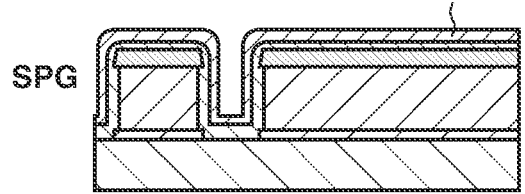
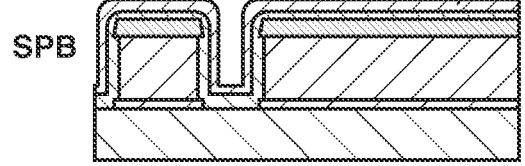

FIG.5A
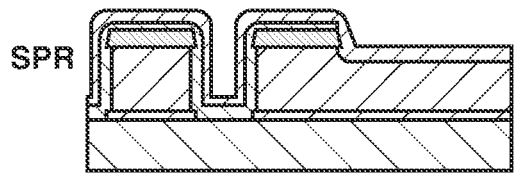
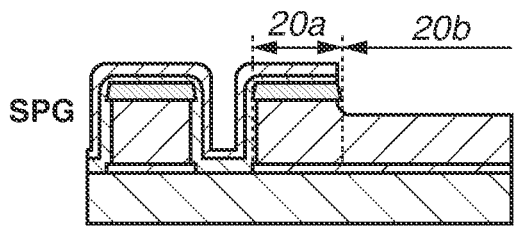
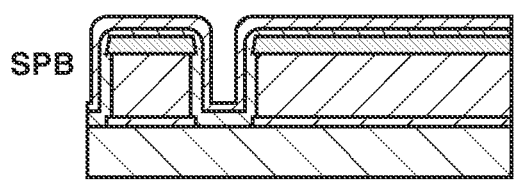
FIG.5B
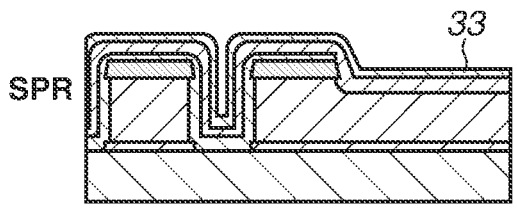
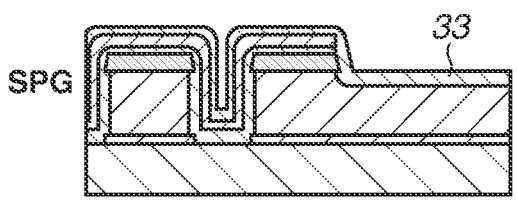
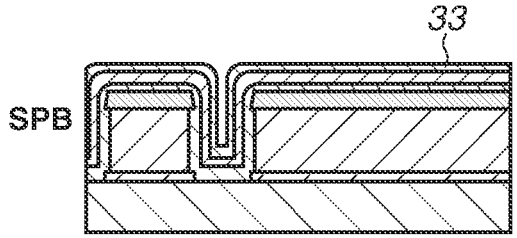
FIG.5C
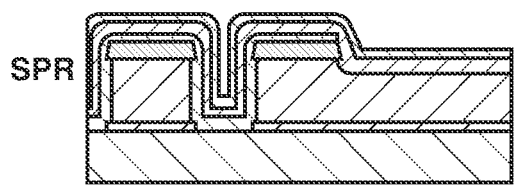
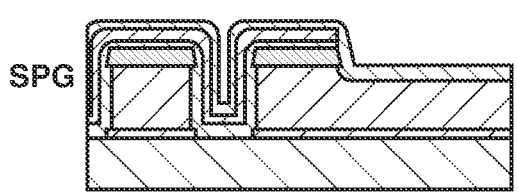
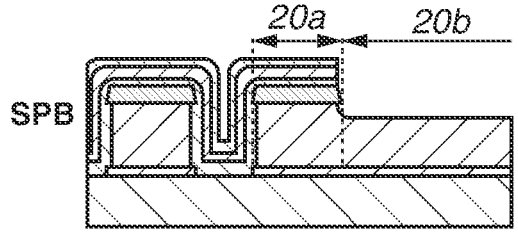
FIG.5D
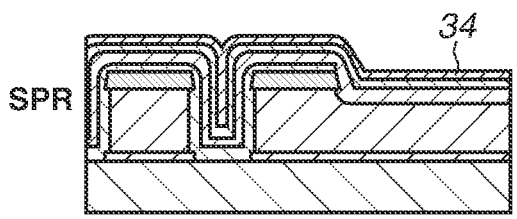
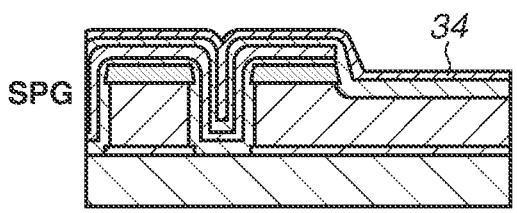
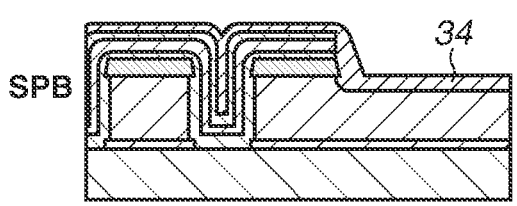

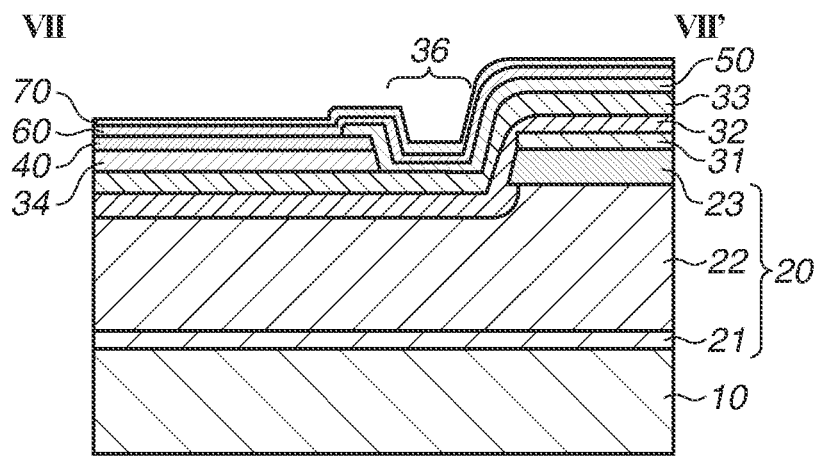
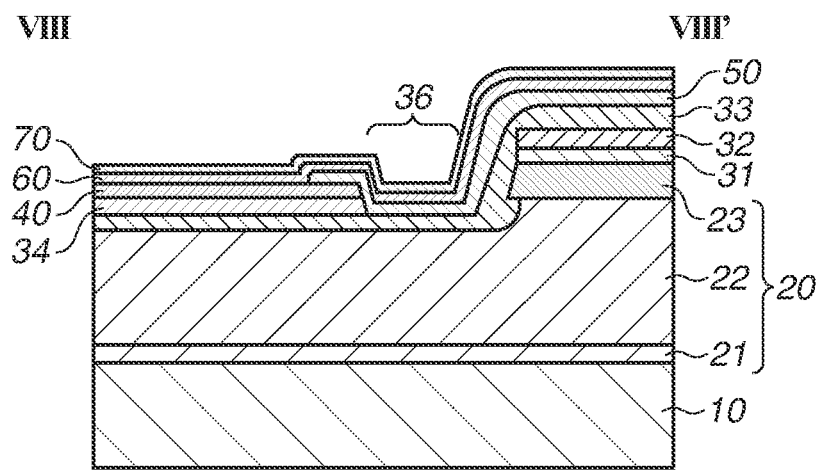
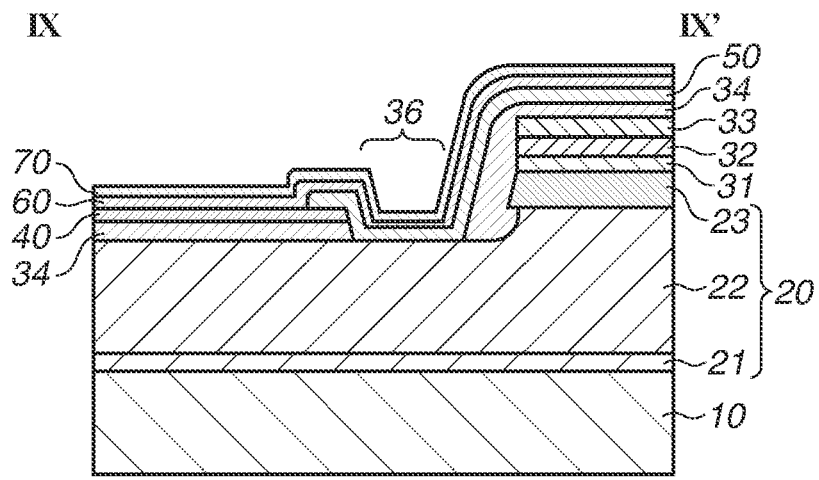

ORGANIC LIGHT EMITTING ELEMENT, DISPLAY APPARATUS, PHOTOELECTRIC CONVERSION APPARATUS, ELECTRONIC DEVICE, ILLUMINATION APPARATUS, AND MOVING BODY

BACKGROUND OF THE INVENTION

Field of the Invention

The present disclosure relates to an organic light emitting element, a display apparatus, a photoelectric conversion apparatus, an electronic device, an illumination apparatus, and a moving body.

Description of the Related Art

An organic electro-luminescence (EL) element is a light emitting element including a pair of electrodes and organic compound layers including a light emitting layer arranged between the pair of electrodes. By taking advantage of its excellent features, such as a surface luminescence property, a lightweight property, and visibility, the organic EL element has been practically used for light emitting apparatuses, such as a flat-panel display, an illumination apparatus, a head-mounted display, and a light source used for a print head of an electrophotographic printer.

Japanese Patent Application Laid-Open No. 2010-244694 discusses a top-emission type organic EL apparatus having an optical resonator structure in which a reflection layer, a positive electrode having light transmissivity, a light emitting layer, and a negative electrode having light reflectivity and light transmissivity are stacked on a substrate in this order. With this configuration, light emitted from the light emitting layer is resonated between the reflection layer and the negative electrode, and light of a resonant wavelength is amplified. Thus, luminance of light emitted therefrom can be increased.

According to the organic EL apparatus discussed in Japanese Patent Application Laid-Open No. 2010-244694, an antireflection layer having reflectivity lower than reflectivity of the reflection layer is formed on the upper side of the reflection layer in a periphery of a pixel, so that resonance occurring in the periphery of the pixel can be prevented thereby. By preventing the resonance occurring in the periphery of the pixel, light of an unintended wavelength can be prevented from being resonated in the periphery of the pixel, so that lowering of output luminance of light of a target wavelength can be suppressed.

In the organic EL apparatus discussed in Japanese Patent Application Laid-Open No. 2010-244694, the antireflection layer is formed on the upper side of the reflection layer in the periphery of a pixel, and thus a height difference occurs in an upper surface of an underlay before the positive electrode (lower electrode) is formed.

In other words, a height of the upper surface of the underlay is low at the central portion of the pixel, and a height of the upper surface of the underlay is high in the periphery of the pixel.

In Japanese Patent Application Laid-Open No. 2010-244694, in a state where a height difference exists in the upper surface as described above, the positive electrode is formed such that an end portion thereof is arranged on top of the antireflection layer in the periphery of the pixel. As a result, a considerable height difference still exists even in a state where the positive electrode is formed. The organic layer including a light emitting layer is continuously arranged on the upper side thereof in an area from the central portion to the periphery portion of the pixel and also in an area of an adjacent pixel. However, if a considerable height difference exists in the underlay, this height difference may cause the organic layer to be considerably reduced in thickness or torn. As a result, the positive electrode and the negative electrode are not sufficiently insulated from each other, and thereby leakage of current occurs between the positive electrode and the negative electrode.

SUMMARY OF THE INVENTION

The present disclosure is directed to an organic light emitting element configured to suppress leakage of current occurring in a positive electrode and a negative electrode.

An organic light emitting element includes a reflection layer, a first electrode, a light emitting layer, and a second electrode, arranged in this order from a side of a substrate. The reflection layer includes a first portion having a first thickness and a second portion having a second thickness smaller than the first thickness. The first electrode overlaps with the second portion in a planar view with respect to the substrate. At least part of an edge of the first electrode overlaps with the second portion in the planar view.

Further features of the present disclosure will become apparent from the following description of exemplary embodiments with reference to the attached drawings.

BRIEF DESCRIPTION OF THE DRAWINGS

FIGS. 4A to 4D are schematic cross-sectional views of the light emitting apparatus in respective manufacturing processing steps according to the first exemplary embodiment.

FIGS. 5A to 5D are schematic cross-sectional views of the light emitting apparatus in respective manufacturing processing steps according to the first exemplary embodiment.

FIGS. 11A to 11C are cross-sectional views of a light emitting element included in the light emitting apparatus according to the third exemplary embodiment.

DESCRIPTION OF THE EMBODIMENTS

Figure 1:
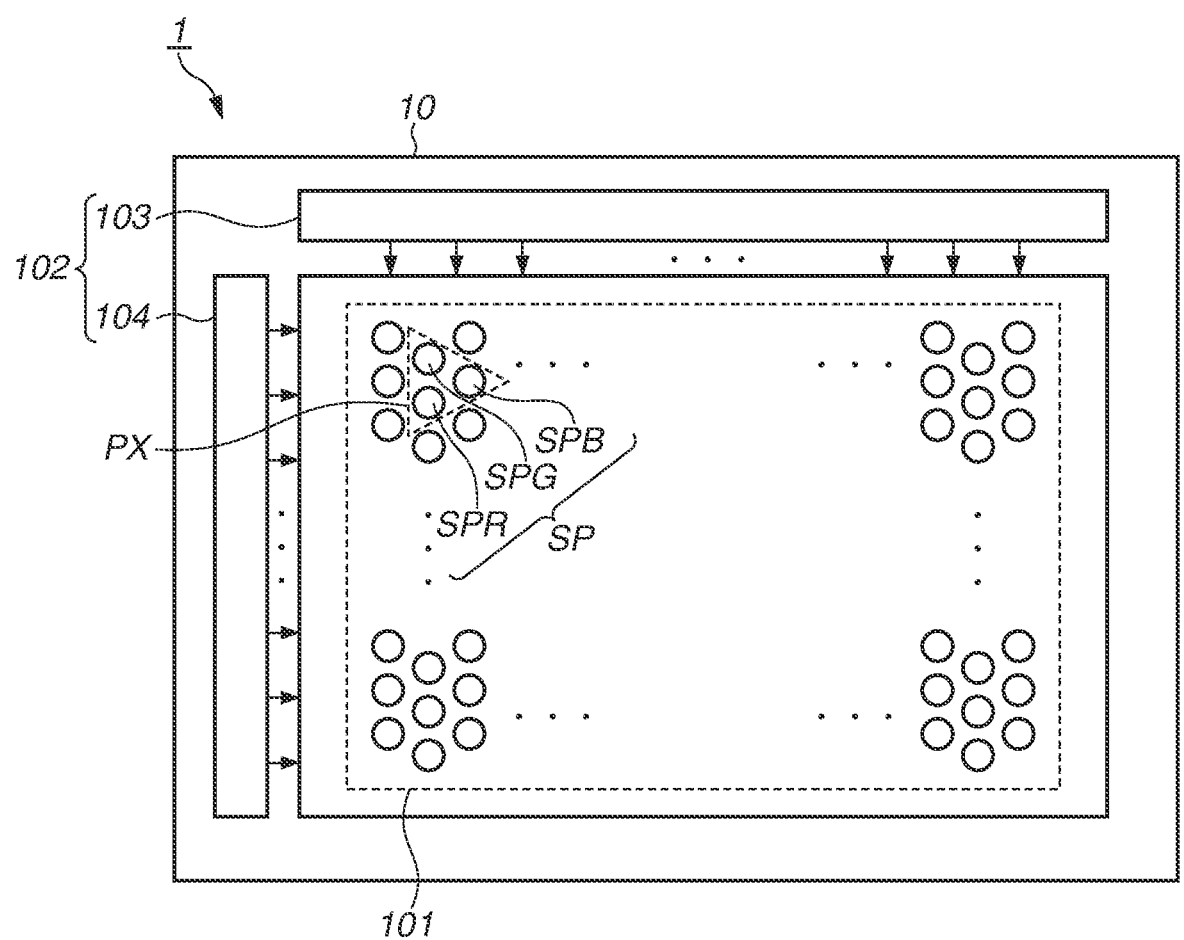
FIG. 1 is a planar view illustrating a configuration of a light emitting apparatus according to a first exemplary embodiment.

Hereinafter, details of an organic light emitting apparatus according to exemplary embodiments of the present disclosure will be now described with reference to the appended drawings.

The below-described exemplary embodiments describe examples of the present disclosure, so that a numerical value, a shape, a material, a constituent element, and arrangement and a connection method of constituent elements described hereinafter are not intended to limit the present disclosure. Although a plurality of features is described in the exemplary embodiments, not all of the features are essentially required for the present disclosure, and the plurality of features may be combined optionally. Further, in the appended drawings, the same reference numerals are applied to constituent elements identical or similar to each other, and duplicative descriptions thereof will be omitted.

In this specification document, words and phrases such as "on the upper side" and "on the lower side" which describe arrangement of constituent elements are used for the sake of convenience when a positional relationship between the constituent elements is described with reference to drawings. Further, the positional relationship between the constituent elements is changed as appropriate depending on a direction the constituent elements are illustrated. Accordingly, words and phrases which describe the arrangement are not limited to those described in the specification document, and can appropriately be reworded or rephrased depending on a situation. Further, wordings such as "upper" and "lower" do not limit the positional relationship between constituent elements to "one element exists directly above (or under) another element" and "one element is directly in contact with another element". For example, an expression such as "an electrode B arranged on the upper side of an insulation layer A" does not always have to describe a state where the electrode B is formed on top of the insulation layer A to be directly in contact therewith, and the expression is not intended to exclude a state where another constituent element is included between the insulation layer A and the electrode B.

A light emitting apparatus according to a first exemplary embodiment of the present disclosure will now be described with reference to FIG. 1 to FIG. 7D.

<Overall Configuration of Light Emitting Apparatus>

FIG. 1 is a planar view illustrating a configuration of a light emitting apparatus 1 according to a first exemplary embodiment. The light emitting apparatus 1 includes a display area 101 and peripheral circuits 102 on a substrate (base material) 10. The display area 101 includes a plurality of pixels PX arranged in a two-dimensional array. The peripheral circuits 102 are circuits for displaying an image on the display area 101, and may include a signal line driving circuit (signal output circuit) 103 and a signal line driving circuit (vertical scanning circuit) 104 functioning as an image display driver.

Each of the pixels PX includes a plurality of sub-pixels SP. In the present exemplary embodiment, each of the pixels PX includes three sub-pixels SP, e.g., a first sub-pixel SPR for emitting light of a first color, a second sub-pixel SPG for emitting light of a second color, and a third sub-pixel SPB for emitting light of a third color. When maximum peak wavelengths of light of the first, the second, and the third colors are respectively expressed as $\lambda R$, $\lambda G$, and $\lambda B$, a relationship "$\lambda R > \lambda G > \lambda B$" is satisfied. The first, the second, and the third colors are, for example, red, green, and blue, respectively.

In the present exemplary embodiment, three sub-pixels SP constitute one pixel PX, but the number of sub-pixels SP that constitute one pixel PX does not necessarily be three. For example, each of the pixels PX may include a fourth sub-pixel SPW for emitting light of a fourth color in addition to the first, the second, and the third sub-pixels SPR, SPG, and SPB. The fourth color may be, for example, white or yellow. Alternatively, four sub-pixels SP having two second sub-pixels SPG may constitute one pixel PX. In the present exemplary embodiment, sub-pixels SP arranged in a delta array will be described as an example. However, the invention is not limited thereto, and the sub-pixels SP may be arranged in a stripe array, a square array, a Bayer array, or a PenTile array.

Each of the sub-pixels SP includes a light emitting element (organic light emitting element) arranged on an upper surface (first surface) of the substrate 10. In the present exemplary embodiment, the first sub-pixel SPR includes a light emitting element for emitting light of the first color, the second sub-pixel SPG includes a light emitting element for emitting light of the second color, and the third sub-pixel SPB includes a light emitting element for emitting light of the third color.

Figure 2:
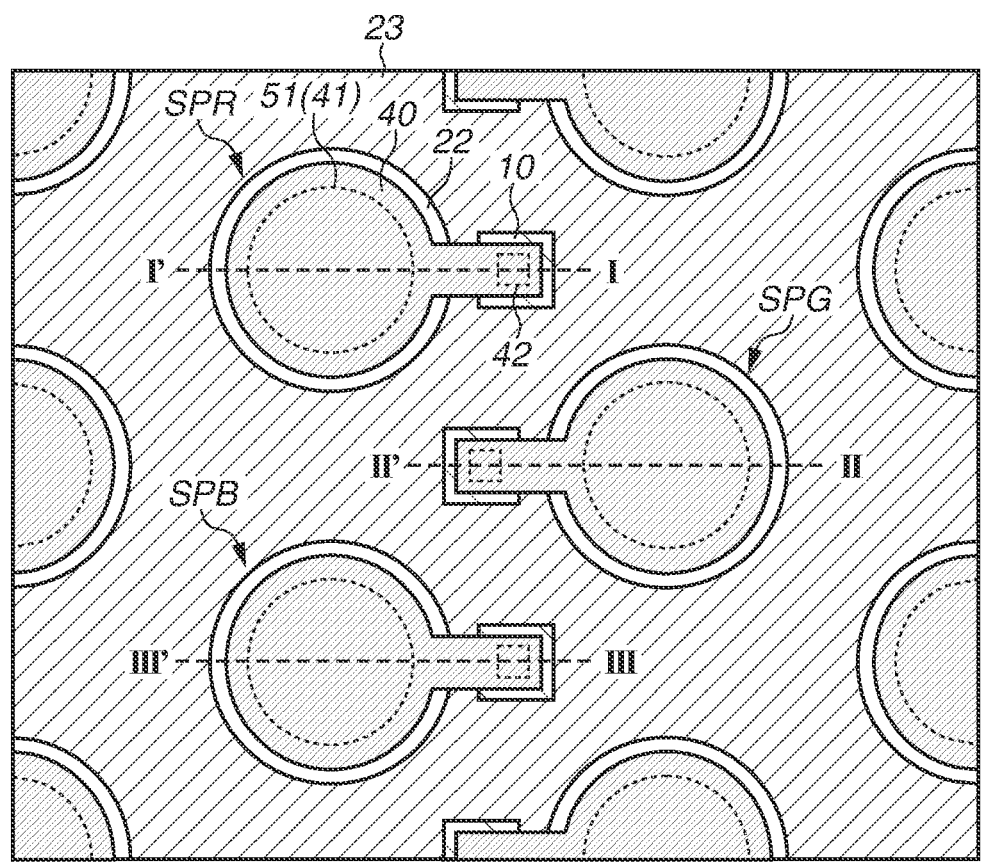
FIG. 2 is a planar view illustrating part of a display area of the light emitting apparatus according to the first exemplary embodiment.

FIG. 2 is a planar view illustrating an enlarged portion of the display area 101 of the light emitting apparatus 1 according to the present exemplary embodiment. FIG. 2 illustrates a state where only part of layers which constitute a light emitting element arranged on each of the sub-pixels SP is seen through another part of the layers. Specifically, only a reflective metal layer 22, a barrier layer 23, a first electrode 40, and a substrate 10 are illustrated from among the layers which constitute the light emitting element.

Although details will be described below, an opening 51 is formed on a pixel separation film 50 arranged on the first electrode 40, and an organic layer 60 is in contact with the first electrode 40 in an area inside the opening 51. In this area, a hole or an electron is injected into the organic layer 60 from the first electrode 40, and the hole and the electron are recombined at the light emitting layer included in the organic layer 60 to emit light. In the present exemplary embodiment, an area inside the opening 51 of the pixel separation film 50 where the first electrode 40 is in contact with the organic layer 60 is a light emitting area 41 of the light emitting element.

Further, in the present exemplary embodiment, the first electrode 40 is independently arranged for each of the sub-pixels SP. When the light emitting element is driven to emit light, a predetermined potential is applied to the first electrode 40. In the present exemplary embodiment, the first electrode 40 is electrically connected to wiring arranged on a lower layer in a contact area 42. A pixel driving circuit is connected to the wiring arranged on the lower layer and driven by the peripheral circuits 102, so that light emission of the light emitting element is controlled.

<Configuration of Light Emitting Element>

Figure 3A:
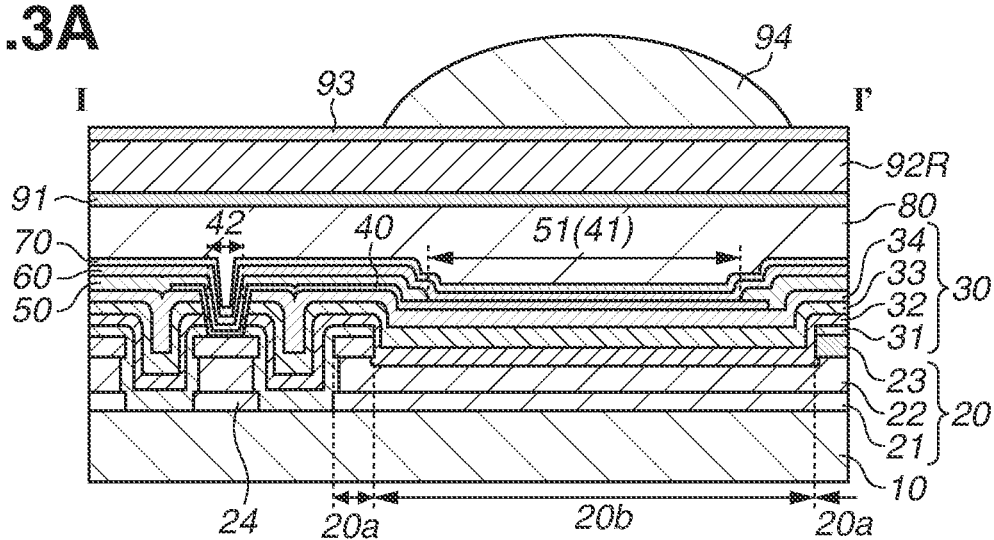
FIGS. 3A to 3C are cross-sectional views of a light emitting element included in the light emitting apparatus according to the first exemplary embodiment.
Figure 3B:
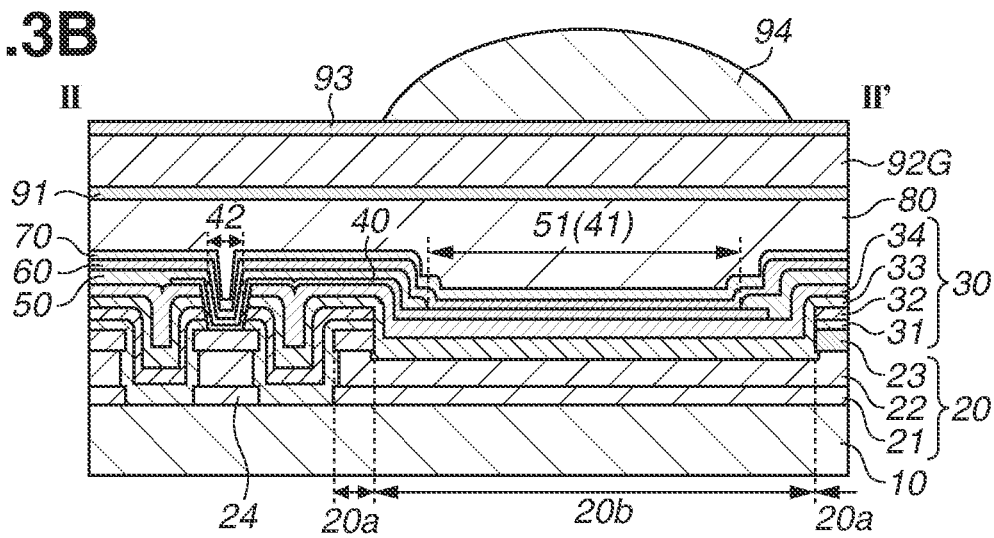
Figure 3C:
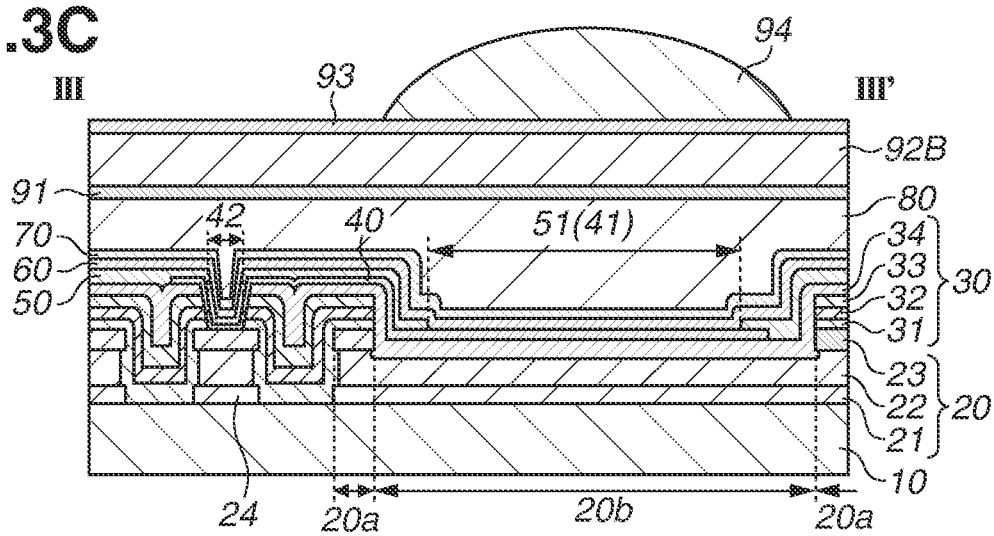

FIGS. 3A to 3C illustrate cross-sectional views of the light emitting elements included in the light emitting apparatus 1 of the present exemplary embodiment. FIG. 3A illustrates a cross-sectional view of the light emitting element arranged on the first sub-pixel SPR, FIG. 3B illustrates a cross-sectional view of the light emitting element arranged on the second sub-pixel SPG, and FIG. 3C illustrates a cross-sectional view of the light emitting element arranged on the third sub-pixel SPB. FIG. 3A is a cross-sectional view taken along a line I-I' illustrated in FIG. 2, FIG. 3B is a cross-sectional view taken along a line II-II' illustrated in FIG. 2, and FIG. 3C is a cross-sectional view taken along a line III-III' illustrated in FIG. 2.

Each of the light emitting elements includes a reflection layer (first layer) 20, an insulation layer 30, a first electrode 40, a pixel separation film 50, an organic layer 60, a second electrode 70, a sealing layer 80, a color filter layer 92, a planarization layer 93, and a microlens 94 arranged in this order from a side of the upper surface of the substrate 10 (i.e., substrate side).

The substrate 10 is formed of a material capable of supporting these layers formed on the upper side thereof. A glass substrate, a plastic substrate such as a polyimide substrate, or a semiconductor substrate such as a silicon substrate can favorably be used as the substrate 10. The substrate 10 may also include a switching element (not illustrated) such as a transistor, wiring, and an interlayer insulation film, in addition to a base member consisting of glass, plastic, or a semiconductor. The transistor may be a metal-oxide semiconductor (MOS) transistor formed on the inner portion of the semiconductor substrate, or may be a thin-film transistor (TFT). In the present exemplary embodiment, the substrate 10 includes a multi-layered wiring layer arranged on a silicon substrate on which a MOS transistor is formed, which is comprised of a plurality of wiring layers and a plurality of interlayer insulation layers alternately stacked one on top of another.

The reflection layer 20 reflects light emitted from the organic layer 60 and emit the light to travel in a direction toward the second electrode 70 from the organic layer 60. In the present exemplary embodiment, the reflection layer 20 has a structure in which a barrier layer 21, a reflective metal layer 22, and a barrier layer 23 are stacked in this order from a side of the substrate 10.

The barrier layers 21 and 23 prevent metallic atoms contained in the reflective metal layer 22 from being diffused to the substrate 10 arranged on the lower side thereof or the layers arranged on the upper side thereof. The barrier layers 21 and 23 are also called barrier metal layers. Metals, such as titanium (Ti), tungsten (W), molybdenum (Mo), and gold (Au), or an alloy of these metals, can be used as the material of the barrier layer 21. A layer made of titanium nitride (TiN) is favorably used as the barrier layer 21 in a case where a substrate containing silicon (Si) is used as the substrate 10, and a layer containing aluminum (Al) is used as the reflective metal layer 22.

The reflective metal layer 22 consists of a metallic material having high reflectivity of light emitted from the organic layer 60. It is preferable that the reflective metal layer 22 have reflectivity of 80% or more of light of a wavelength having the intensity the highest from among the intensity of light emitted from the organic layer 60. Examples of metallic materials to constitute the reflective metal layer 22 include metals such as aluminum (Al) and silver (Ag), and an alloy of these metals which contain silicon (Si), copper (Cu), nickel (Ni), and neodymium (Nd) as additives.

The barrier layer 23 is arranged on the upper side of the reflective metal layer 22. Assuming that a wavelength of light having the intensity the highest from among the intensity of light emitted from the organic layer 60 is referred to as a "first wavelength", the barrier layer 23 has reflectivity of light of the first wavelength lower than that of the reflective metal layer 22. It is thus preferable that the barrier layer 23 is not arranged on the lower side of the light emitting area 41 of the light emitting element. With this configuration, light extraction efficiency of the light emitting element can be improved. In contrast, it is preferable that the barrier layer 23 be arranged in an area other than the area on the lower side of the light emitting area 41. Since the barrier layer 23 has reflectivity lower than that of the reflective metal layer 22, the barrier layer 23 can also function as an antireflection layer. It is preferable that the barrier layer 23 functioning as an antireflection layer be arranged in an area of the reflection layer 20 where light cannot be extracted from the light emitting element even if light from the organic layer 60 is reflected thereby. With this configuration, light reflected on the reflection layer 20 can be prevented from being emitted to the outside from an unintended light emitting element such as an adjacent light emitting element. As a result, a quality level of light emitted from the light emitting element and the light emitting apparatus can be improved.

In the present exemplary embodiment, as illustrated in FIG. 2, the opening 51 of the pixel separation film 50 has a circular shape. Thus, the light emitting area 41 also has a circular shape. The barrier layer 23 is arranged to surround the light emitting area 41 in a planar view. In other words, a first portion 20a surrounds a second portion 20b in the planar view. In this way, an area having low reflectivity can be arranged on the entire circumference area on the outside of the light emitting area 41, so that it is possible to suppress emission of light from an unintended light emitting element by efficiently suppressing backlight. In here, "planar view" refers to a view seen from a direction perpendicular to the upper surface of the substrate 10.

Accordingly, as illustrated in FIGS. 3A to 3C, the reflection layer 20 includes the first portion 20a where the barrier layer 23 is arranged and the second portion 20b where the barrier layer 23 is not arranged. If a thickness of the first portion 20a is a first thickness T1 and a thickness of the second portion 20b is a second thickness T2, a relationship "T1>T2" is satisfied. In other words, the reflection layer 20 includes the first portion 20a having the first thickness T1 and the second portion 20b having the second thickness T2 smaller than the first thickness T1. Herein, "thickness" refers to a length in a direction perpendicular to the upper surface of the substrate 10.

In the present exemplary embodiment, the first portion 20a is a portion where a distance from the substrate 10 to the upper surface of the reflection layer 20 is a first distance, and the second portion 20b is a portion where a distance from the substrate 10 to the upper surface of the reflection layer 20 is a second distance, which is shorter than the first distance.

Further, in the present exemplary embodiment, as described below, the barrier layer 23 is formed on the upper side of the reflective metal layer 22, and the reflective metal layer 22 is exposed by partially etching and removing the barrier layer 23. At this time, the barrier layer 23 is etched, so that the reflective metal layer 22 on the lower side of the removed barrier layer 23 is over-etched. Thus, the thicknesses of the reflective metal layer 22 itself is different between a portion where the barrier layer 23 is arranged and a portion where the barrier layer 23 is not arranged. More specifically, the reflective metal layer 22 positioned on the lower side of the barrier layer 23 has a thickness greater than a thickness of the reflective metal layer 22 where the barrier layer 23 is not arranged on the upper side thereof. In addition, part of the reflective metal layer 22 positioned on the lower side of the barrier layer 23, more specifically, the reflective metal layer 22 in the vicinity of the portion where the barrier layer 23 is not arranged on the upper side thereof, can also be etched and reduced in thickness because of side-etching, as illustrated in FIGS. 3A to 3C.

As described above, the barrier layer 23 is arranged on the first portion 20a, and the barrier layer 23 is not arranged on the second portion 20b. Thus, the upper surface of the first portion 20a is comprised of the barrier layer 23, whereas the upper surface of the second portion 20b is comprised of the reflective metal layer 22. Assuming that the reflective metal layer 22 is referred to as a "first layer" consisting of a first material, and the barrier layer 23 is referred to as a "second layer" consisting of a second material different from the first material, it can also be said that the upper surface of the first portion 20a is comprised of the second layer, and the upper surface of the second portion 20b is comprised of the first layer. Further, the reflective metal layer 22 may have a thin oxide film on its upper surface. The first material may contain aluminum, and the second material may be any one of nitride, oxide, and oxynitride. Although the second material may be any one of titanium nitride, titanium oxide, and titanium oxynitride, it is preferable that the second material be the titanium nitride. As described above, when the barrier layer 23 is removed, the barrier layer 23 is over-etched. Thus, a thickness of the reflective metal layer 22 at the first portion 20a is different from a thickness of the reflective metal layer 22 at the second portion 20b. Specifically, a thickness of the first layer at the first portion 20a is thicker than a thickness of the first layer at the second portion 20b.

The insulation layer 30 having light-translucency is arranged on the upper side of the reflection layer 20. Herein, "light-translucency" refers to a property of transmitting light of a wavelength having intensity the highest from among the intensity of light emitted from the organic layer 60 at a light transmission rate of 90% or more.

In the present exemplary embodiment, the insulation layer 30 has at least any one of a lower insulation film 31, a first optical adjustment layer 32, a second optical adjustment layer 33, and a third optical adjustment layer 34. A layer configuration of the insulation layer 30 arranged on the upper side of the reflection layer 20 of an area without having the barrier layer 23 (effective reflection area) varies depending on a color of light emitted from a light emitting element. More specifically, an insulation layer 30R arranged on the upper side of an effective reflection area of the light emitting element arranged on the first sub-pixel SPR includes the first optical adjustment layer 32, the second optical adjustment layer 33, and the third optical adjustment layer 34 stacked in this order from a side of the reflection layer 20. An insulation layer 30G arranged on the upper side of an effective reflection area of the light emitting element arranged on the second sub-pixel SPG includes the second optical adjustment layer 33 and the third optical adjustment layer 34 stacked in this order from a side of the reflection layer 20. An insulation layer 30B arranged on the upper side of an effective reflection area of the light emitting element arranged on the third sub-pixel SPB includes the third optical adjustment layer 34. The insulation layer 30 arranged on the upper side of the effective reflection area has thereby a different thickness depending on a color of light emitted from each of the light emitting elements.

In other words, a relationship "T30R>T30G>T30B" is satisfied, where T30R is a thickness of the insulation layer 30R, T30G is a thickness of the insulation layer 30G, and T30B is a thickness of the insulation layer 30B.

In the present exemplary embodiment, an optical distance between the light emitting position of the light emitting layer of the organic layer 60 and a reflection surface of the reflection layer 20 is optimized for each of the light emitting elements by adjusting a thickness of the insulation layer 30 arranged on the upper side of the effective reflection area by changing a layer configuration. More specifically, the optical distance is optimized such that an optical interference condition for mutually intensifying light emitted from the sub-pixels SP is satisfied. With this configuration, light extracted from the light emitting apparatus can be intensified by the optical interference. Light can be emitted in a front direction more efficiently if an optical condition for intensifying light emitted in the front direction is satisfied. Further, it is known that a half-value width of a light-emission spectrum of light intensified by the optical interference becomes smaller than that of a light-emission spectrum of light before the optical interference. In this way, it is possible to improve color purity thereof.

Each of the layers constituting the insulation layer 30 can be formed by a method, such as a chemical vapor deposition (CVD) method or a physical vapor deposition (PVD) method. Each of the layers constituting the insulation layer 30 may be made of materials, such as silicon nitride (SiNx), silicon oxide (SiOx), and silicon oxynitride (SiON).

The first electrode 40 is an anode (positive electrode) electrically separated and arranged for each of the light emitting elements. In other words, the first electrode 40 is electrically separated and arranged for each of sub-pixels SP. The first electrode 40 is also called "lower electrode", "pixel electrode", or "individual electrode". The first electrode 40 is made of a conductive material having light-translucency. Light emitted from the organic layer 60 is transmitted through the conductive material to be introduced to the reflection layer 20. The light reflected on the reflection layer 20 is transmitted through the conductive material to be emitted from a side of the second electrode 70. Examples of a material of the first electrode 40 include an oxide conductive material, such as indium tin oxide (ITO), indium zinc oxide (IZO), zinc oxide (ZnO), aluminum-doped zinc oxide (AZO), and indium gallium zinc oxide (IGZO). The first electrode 40 may have a layered structure as long as the first electrode 40 has appropriate light-translucency. Herein, "light-translucency" refers to a property of transmitting light of a wavelength having intensity the highest from among the intensity of light emitted from the organic layer 60 at a light transmission rate of 90% or more.

The pixel separation film 50 is arranged on the upper side of the first electrode 40 to cover an end portion of the first electrode 40. The pixel separation film 50 is an insulation film which defines the light emitting area of each of the sub-pixels SP. The first electrode 40 and the organic layer 60 are in contact with each other in an area inside the opening 51 formed on the pixel separation film 50. The pixel separation film 50 is also called "partition", "bank", or "pixel defining layer (PDL)". A material and a formation method of the pixel separation film 50 are similar to those used for the insulation layer 30. The insulation layer 30 and the pixel separation film 50 can be distinguished from one another as the first insulation layer and the second insulation layer, respectively.

The organic layer 60 is arranged between the first electrode 40 and the second electrode 70. The organic layer 60 is commonly and continuously arranged on a plurality of light emitting elements, on the upper side of the first electrode 40 and the pixel separation film 50. It can also be said that one organic layer 60 is shared by the plurality of light emitting elements. The organic layer 60 may commonly be arranged on a plurality of sub-pixels SP constituting one pixel PX. The organic layer 60 may separately be arranged on one pixel PX and another pixel PX adjacent thereto, or may commonly be arranged on a plurality of pixels PX. The organic layer 60 may integrally be formed on the entire surface of the display area 101 of the light emitting apparatus 1 where an image is displayed. In a case where the organic layer 60 is comprised of a plurality of layers, at least part of the layers may be arranged on a plurality of light emitting elements continuously. If the sub-pixel SP is minute in size, it is particularly effective to commonly arrange the organic layer 60 over the plurality of sub-pixels SP.

Assume that the first electrode 40 included in the first sub-pixel SPR is referred to as a "first lower electrode 40R", the first electrode 40 included in the second sub-pixel SPG is referred to as a "second lower electrode 40G", and the first electrode 40 included in the third sub-pixel SPB is referred to as a "third lower electrode 40B". At this time, at least part of the organic layer 60 may satisfy the followings. In other words, at least part of the organic layer 60 may continuously be arranged on at least any two of a portion between the upper side of the first lower electrode 40R and the upper side of the second lower electrode 40G, a portion between the upper side of the second lower electrode 40G and the upper side of the third lower electrode 40B, and a portion between the upper side of the third lower electrode 40B and the upper side of the first lower electrode 40R. Further, at least part of the organic layer 60 may continuously be arranged on all of the portion between the upper side of the first lower electrode 40R and the upper side of the second lower electrode 40G, the portion between the upper side of the second lower electrode 40G and the upper side of the third lower electrode 40B, and the portion between the upper side of the third lower electrode 40B and the upper side of the first lower electrode 40R.

The above description "being arranged continuously" means a state where something is arranged without being discontinued halfway. The above description "being continuously arranged in a portion between the upper side of the first lower electrode 40R and the upper side of the second lower electrode 40G" means a state where something is arranged in a portion between the upper side of the first lower electrode 40R and the upper side of the second lower electrode 40G without being discontinued.

The organic layer 60 includes a light emitting layer where a hole supplied from the first electrode 40 and an electron supplied from the second lower electrode 40 are recombined to emit light. The organic layer 60 may include a hole transport layer, a light emitting layer, and an electron transport layer. Materials appropriate in terms of light emitting efficiency, a driving life-span, and optical interference can be selected as the materials of the organic layer 60. The hole transport layer may also function as an electron blocking layer or a hole injection layer, and may have a layered structure including a hole injection layer, a hole transport layer, and an electron blocking layer. The light emitting layer may have a layered structure including light emitting layers for emitting light of different colors, or may be a mixed layer in which light emitting dopant for emitting light of different colors is mixed. The light emitting layer may contain a first light emitting material for emitting light of a first color, a second light emitting material for emitting light of a second color, and a third light emitting material for emitting light of a third color, such that white light can be acquired by mixing emitted light of respective colors. The first, the second, and the third colors are, for example, red, green, and blue, respectively. The light emitting layer may contain light emitting materials of complementary colors such as a blue light emitting material and a yellow light emitting material. The electron transport layer may function as a hole blocking layer or an electron injection layer, and may have a layered structure consisting of an electron injection layer, an electron transport layer, and a hole blocking layer.

The organic layer 60 may also include a plurality of light emitting layers and interlayers arranged between a plurality of functional layers. The light emitting apparatus 1 may be a tandem structure light emitting apparatus including a charge generation layer as the interlayer. The tandem structure may have a charge transport layer, such as a hole transport layer or an electron transport layer, between the charge generation layer and the light emitting layer.

The charge generation layer includes an electron-donating material and an electron-accepting material, and generates electric charge.

The electron-donating material is a material which provides an electron, and the electron-accepting material is a material which receives that electron. Through the configuration, positive and negative electric charges are generated in the charge generation layer, so that positive or negative electric charge can be supplied to the layers on the upper side and the lower side of the charge generation layer.

The electron-donating material may be an alkali metal such as lithium (Li) or cesium (Cs). The electron-donating material may also be lithium fluoride (LiF), lithium complex, cesium carbonate, or cesium complex. In this case, an electron-donating property can be developed when the electron-donating material is contained together with a reducible material, such as aluminum (Al), magnesium (Mg), or calcium (Ca). The electron-receiving material may be an inorganic material such as molybdenum oxide, or may be an organic material such as [dipyrazino[2,3-f:2',3'-h]quinoxaline-2,3,6,7,10,11-hexacarbonitrile] (HAT-CN). The electron-receiving material and the electron-donating material may be mixed or stacked.

The second electrode 70 is a cathode (negative electrode) arranged on the upper side of the organic layer 60. The second electrode 70 is made of a conductive material having light-translucency, and transmits at least part of light that has reached a lower surface of the second electrode 70. The second electrode 70 is continuously formed on a plurality of light emitting elements and shared by the plurality of light emitting elements. Similar to the organic layer 60, the second electrode 70 may integrally be formed on the entire surface of the display area 101 of the light emitting apparatus 1 where an image is displayed. The second electrode 70 may function as a semi-transmissive reflection layer having semi-transmissive reflectivity, i.e., a characteristic of transmitting part of light while reflecting another part thereof. The second electrode 70 can be formed of metals, such as magnesium and silver, an alloy consisting primarily of magnesium and silver, or an alloy material containing an alkali metal and an alkaline-earth metal. Further, an oxide conductive body made of ITO, IZO, ZnO, AZO, or IGZO can also be used as a material of the second electrode 70. The second electrode 70 may have a layered structure as long as the second electrode 70 has appropriate translucency. Herein, "light-translucency" refers to a property of transmitting light of a wavelength having intensity the highest from among the intensity of light emitted from the organic layer 60 at a light transmission rate of 90% or more.

The sealing layer 80 is continuously formed over a plurality of light emitting elements on the upper side of the second electrode 70, so that the sealing layer 80 is shared by the plurality of light emitting elements. The sealing layer 80 may contain an inorganic material having light-translucency and low transmissivity of external oxygen and moisture. The sealing layer 80 is also called "moisture prevention layer" or "protection layer". The sealing layer 80 may contain substances, such as silicon nitride (SiNx), silicon oxynitride (e.g., SiON), aluminum oxide (e.g., $Al_2O_3$), silicon oxide (SiOx), and titanium oxide (e.g., $TiO_2$). The silicon nitride and the silicon oxynitride are formed through, for example, a CVD method or a sputtering method. In contrast, the aluminum oxide, the silicon oxide, and the titanium oxide may be formed through an atomic layer deposition (ALD) method. A combination of the constituent material and the manufacturing method of the sealing layer 80 is not limited to the above-described examples, and the sealing layer 80 may be manufactured with consideration for a thickness of a layer to be formed and time required for forming the layer. The sealing layer 80 may either have a single layer structure or a layered structure as long as the sealing layer 80 can transmit light passing through the second electrode 70 and has a sufficient moisture-blocking property.

The color filter layer 92 is formed on the upper side of the sealing layer 80. As described above, the color filter layer 92 may include a first color filter 92R, a second color filter 92G, and a third color filter 92B. The first color filter 92R transmits light of the first color, the second color filter 92G transmits light of the second color, and the third color filter 92B transmits light of the third color. The adjacent two filters, e.g., the first color filter 92R and the second color filter 92G, included in the color filter layer 92 may be arranged adjacent to each other without an interspace. Further, a color filter may be arranged in such a state that an end portion thereof is placed on top of an end portion of a color filter of another color.

A planarization layer 91 is formed between the sealing layer 80 and the color filter layer 92, and a planarization layer 93 is formed on the upper side of the color filter layer 92. The planarization layer 91 planarizes irregularities of the upper surface of the sealing layer 80, and the planarization layer 93 planarizes irregularities of the upper surface of the color filter layer 92. The planarization layers 91 and 93 are made of, for example, resin.

The microlens 94 is arranged to overlap with a center of the light emitting area of the light emitting element in the planar view, and functions to deflect light emitted from the organic layer 60 to efficiently extract the light in a desired direction. The light emitting area of the light emitting element is defined by the opening 51 of the pixel separation film 50, but a center of the light emitting area may be a centroid of the opening 51 in the planar view.

A conventionally-known microlens can be used as the microlens 94. The microlens 94 may be made of resin. The microlens 94 is formed in such a way that, for example, a film made of a material for forming the microlens 94 is formed, and then, the film is exposed and developed by using a mask having a continuous gradation change. Examples of the mask include a gray mask and an area gradation mask. Further, after the microlens 94 is formed by the above-described exposure and development processing, a lens shape thereof may be adjusted by executing etch-back processing. As long as the microlens 94 can refract emitted light, the microlens 94 may have a spherical surface or an aspheric surface, and may have an asymmetric cross-sectional shape.

It is preferable that a side of the light emitting surface of the microlens 94, i.e., a side opposite to a side of the color filter layer 92, be filled with a material (typically, air) having an refractive index lower than that of the microlens 94. With this configuration, a light condensing effect of the microlens 94 can be improved.

The light emitting element according to the present exemplary embodiment further includes an anode contact layer 24 electrically separated from the reflection layer 20 arranged on the lower side of the light emitting area 41. The anode contact layer 24 is configured similarly as the reflection layer 20 arranged on the lower side of the light emitting area 41. After the anode contact layer 24 is formed in a manufacturing processing step same as a manufacturing processing step of the reflection layer 20, a groove is formed by etching, so that the anode contact layer 24 is separated. Accordingly, the anode contact layer 24 and the reflection layer 20 are arranged on the same layer. An area where the anode contact layer 24 is arranged in the planar view is referred to as an "anode contact area". The insulation layer 30 has a via hole 301 in this anode contact area, so that the anode contact layer 24 and the first electrode 40 are electrically connected to each other via the via hole 301. The anode contact layer 24 is a conductive member electrically connected to the wiring layer included in the substrate 10 via a conductive plug (not illustrated) arranged on the lower side of the anode contact layer 24. Accordingly, the first electrode 40 is electrically connected to the wiring layer included in the substrate 10 by being connected to the anode contact layer 24. In the present exemplary embodiment, the uppermost layer of the anode contact layer 24 is the barrier layer 23. In a case where ITO is used for the first electrode 40, and aluminum is used for the reflective metal layer 22, resistance will be increased when the first electrode 40 is directly in contact with the reflective metal layer 22. Thus, the first electrode 40 is in contact with the reflective metal layer 22 via the barrier layer 23 consisting of a material other than aluminum, so that an increase in resistance can be suppressed.

Features of the Present Exemplary Embodiment

Features of a light emitting element included in the light emitting apparatus according to the present exemplary embodiment of the present disclosure will now be described.

As illustrated in FIGS. 3A to 3C, the light emitting element according to the present exemplary embodiment includes the first electrode 40 which overlaps with the second portion 20b of the reflection layer 20 in the planar view with respect to the substrate 10. Herein, as described above, from among the layers constituting the reflection layer 20, at least the barrier layer 23 is removed from the second portion 20b, so that a thickness thereof is reduced. Then, as illustrated in FIG. 2 and FIGS. 3A to 3C, in the light emitting element of the present exemplary embodiment, at least part of the edge of the first electrode 40 overlaps with the second portion 20b of the reflection layer 20 in the planar view with respect to the substrate 10. Herein, the edge of the first electrode 40 refers to an outer edge of the first electrode 40 in the planar view, indicated by a solid line illustrated in FIG. 2. In the present exemplary embodiment, the first electrode 40 has a substantially circular portion having a shape similar to the shape of the opening 51 of the pixel separation film 50 and an extending portion extending to the anode contact area from the substantially circular portion.

In the present exemplary embodiment, the first electrode 40 is basically arranged on the upper side of the second portion 20b of the reflection layer 20 except for the extending portion that is partially arranged on the upper side of the first portion 20a.

In FIGS. 3A to 3C, the edge of the first electrode 40 (a right edge of the first electrode 40 in FIGS. 3A to 3C) is arranged on the upper side of the second portion 20b portion, which is a thin portion of the reflection layer 20. Herein, in order to make a comparison, the first electrode 40 which is extended further, whose edge is arranged on the upper side of the thick portion of the reflection layer 20, which is the first portion 20a, is considered as a comparative configuration. In this configuration, at the first portion 20a on the right side in FIGS. 3A to 3C, the first electrode 40 is arranged between the third optical adjustment layer 34 and the pixel separation film 50.

The organic layer 60 is formed on a surface having irregularities formed by the layers including the pixel separation film 50. In both of the present exemplary embodiment and the comparative configuration, the reflection layer 20 has the first portion 20a having the first thickness T1 and the second portion 20b having the second thickness T2, and thereby a height difference caused by this thickness difference exists in the upper surface immediately before the organic layer 60 is formed. If there is a considerable height difference, the organic layer 60 may easily be reduced in thickness or discontinued at a portion having the height difference. In this case, there is a possibility that current leakage occurs between the first electrode 40 and the second electrode 70 at a portion where the organic layer 60 is reduced in thickness. If current leakage occurs, light-emitting failure may occur because of considerable decline in the light emitting efficiency of the light emitting element, so that a display quality level of the light emitting apparatus may be degraded.

A height difference between the upper portion of the first portion 20a and the upper portion of the second portion 20b, existing in the upper surface immediately before the organic layer 60 is formed, is considered with respect to the present exemplary embodiment and the comparative configuration. In the comparative configuration, the insulation layer 30, the first electrode 40, and the pixel separation film 50 are stacked on the upper side of the first portion 20a from a side of the substrate 10. In contrast, in the present exemplary embodiment, only the insulation layer 30 and the pixel separation film 50 are stacked on the upper side of the first portion 20a on the right side in FIGS. 3A to 3C from the side of the substrate 10. In other words, in the present exemplary embodiment, the first electrode 40 is not arranged on the upper side of the first portion 20a on the right side in FIGS. 3A to 3C. Thus, a height of the upper surface immediately before the organic layer 60 is formed is reduced by the height of the first electrode 40, at the first portion 20a on the right side in FIGS. 3A to 3C. Therefore, in the present exemplary embodiment, a height difference between the upper portion of the first portion 20a and the upper portion of the second portion 20b is smaller than a height difference existing in the comparative configuration. As a result, reduction in thickness of the organic layer 60 caused by a height difference existing in the formation surface is suppressed, so that current leakage occurring in the first electrode 40 and the second electrode 70 can also be suppressed.

<Manufacturing Method>

A manufacturing method (formation method) of the light emitting element and the light emitting apparatus according to the present exemplary embodiment will now be described according to the order of processing steps. FIGS. 4A to 7D illustrate schematic cross-sectional views in respective manufacturing processing steps of the light emitting apparatus 1 of the present exemplary embodiment. In each of FIGS. 4 to 7D, with respect to three light emitting elements respectively arranged on the sub-pixels SPR, SPG, and SPB, schematic cross-sectional views in a same processing step are illustrated side by side. In here, a dimension, a material, and a formation condition described below are merely examples, and other dimensions or methods can be selected as appropriate.

1. As illustrated in FIG. 4A, the reflection layer 20 is formed and patterned on the upper side of the substrate 10. In the present exemplary embodiment, as described above, the substrate 10 has a structure in which a multi-layered wiring layer comprised of a plurality of wiring layers and a plurality of interlayer insulation layers alternately stacked one on top of another is arranged on a silicon substrate on which a MOS transistor is formed. The uppermost layer of the multi-layered wiring layer is the interlayer insulation layer, and the barrier layer 21, the reflective metal layer 22, and the barrier layer 23 are formed on the upper side of the interlayer insulation layer in this order. Herein, the barrier layers 21 and 23 are formed of TiN, and the reflective metal layer 22 is formed of an Al alloy. Thereafter, the reflection layer 20 is patterned by photolithography. As illustrated in FIG. 4A, after patterning is performed, the three light emitting elements respectively arranged on the sub-pixels SPR, SPG, and SPB have the same shapes.

2. As illustrated in FIG. 4B, on the upper side of the substrate 10 on which the reflection layer 20 is formed, a silicon oxide (SiOx) layer having a layer thickness of 20 nanometers (nm) is formed as the lower insulation layer 31 through the CVD method.

3. As illustrated in FIG. 4C, from among the barrier layers 23 arranged on the three sub-pixels SPR, SPG, and SPB, only the barrier layer 23 arranged on the first sub-pixel SPR is etched and removed. Through the processing, the reflection layer 20 arranged on the first sub-pixel SPR has the first portion 20a and the second portion 20b where the barrier layer 23 is not arranged. At this time, the lower insulation layer 31 formed on the upper side of the reflection layer 20 of the first sub-pixel SPR is removed partially, and the upper portion of the reflective metal layer 22 is also removed.

4. As illustrated in FIG. 4D, a silicon oxide (SiOx) layer having a layer thickness of 65 nm is deposited as the first optical adjustment layer 32 through the CVD method on the entire uppermost surface.

5. As illustrated in FIG. 5A, from among the barrier layers 23 arranged on the three sub-pixels SPR, SPG, and SPB, only the barrier layer 23 arranged on the second sub-pixel SPG is etched and removed. Through the processing, the reflection layer 20 arranged on the second sub-pixel SPG has the first portion 20a and the second portion 20b where the barrier layer 23 is not arranged. At this time, the lower insulation layer 31 and the first optical adjustment layer 32 formed on the upper side of the reflection layer 20 of the second sub-pixel SPG are removed, and the upper portion of the reflective metal layer 22 is also removed partially.

6. As illustrated in FIG. 5B, a silicon oxide (SiOx) layer having a layer thickness of 55 nm is deposited as the second optical adjustment layer 33 through the CVD method on the entire uppermost surface.

7. As illustrated in FIG. 5C, from among the barrier layers 23 arranged on the three sub-pixels SPR, SPG, and SPB, only the barrier layer 23 arranged on the third sub-pixel SPB is etched and removed. Through the processing, the reflection layer 20 arranged on the third sub-pixel SPB has the first portion 20a and the second portion 20b where the barrier layer 23 is not arranged. At this time, the lower insulation layer 31, the first optical adjustment layer 32, and the second optical adjustment layer 33 formed on the upper side of the reflection layer 20 of the third sub-pixel SPB are removed, and the upper portion of the reflective metal layer 22 is also removed partially.

8. As illustrated in FIG. 5D, a silicon oxide (SiOx) layer having a layer thickness of 110 nm is deposited as the third optical adjustment layer 34 through the CVD method on the entire uppermost surface. In the present exemplary embodiment, the first sub-pixel SPR is a sub-pixel which emits red light, the second sub-pixel SPG is a sub-pixel which emits green light, and the third sub-pixel SPB is a sub-pixel which emits blue light. Through the above-described processing steps, film thicknesses of the first optical adjustment layer 32, the second optical adjustment layer 33, and the third optical adjustment layer 34 are adjusted, such that a total film thickness thereof satisfies the optical interference condition for mutually intensifying red light. Further, film thicknesses of the second optical adjustment layer 33 and the third optical adjustment layer 34 are adjusted, such that a total film thickness thereof satisfies the optical interference condition for mutually intensifying green light. Furthermore, a film thickness of the third optical adjustment layer 34 is adjusted, such that the film thickness thereof satisfies the optical interference condition for mutually intensifying blue light.

Figure 6A:
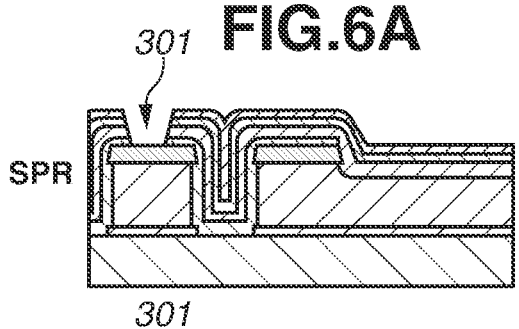
FIGS. 6A to 6D are schematic cross-sectional views of the light emitting apparatus in respective manufacturing processing steps according to the first exemplary embodiment.

9. As illustrated in FIG. 6A, a via hole 301 is created on the insulation layer 30 (comprised of the lower insulation layer 31, the first optical adjustment layer 32, the second optical adjustment layer 33, and the third optical adjustment layer 34) arranged on the upper side of the anode contact layer 24.

Figure 6B:
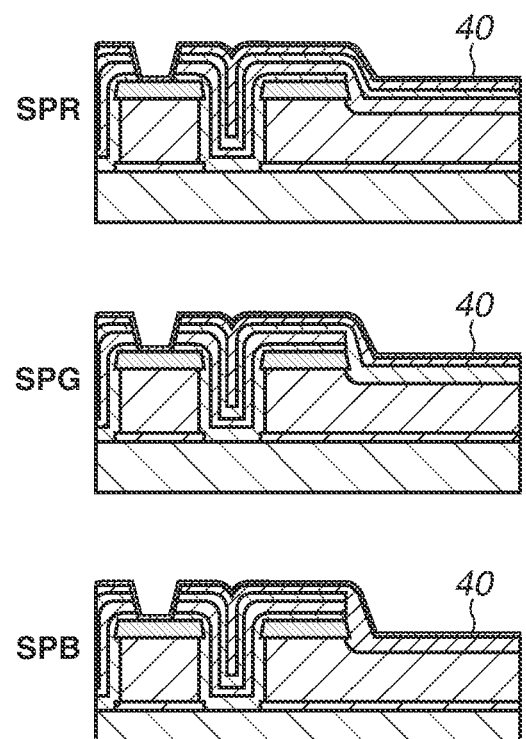
Figure 6C:
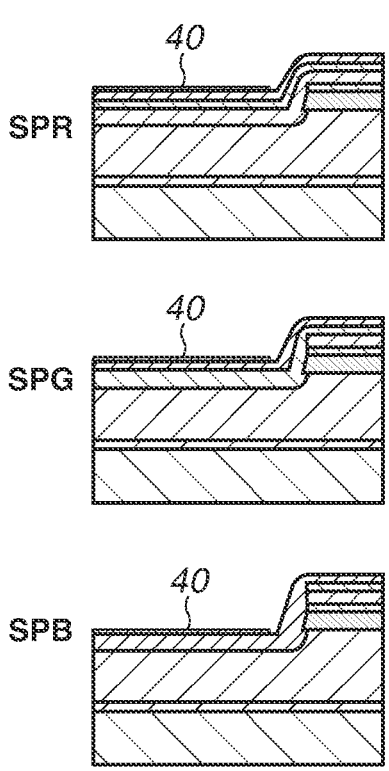

10. As illustrated in FIG. 6B, ITO is deposited as the first electrode 40 on the entire uppermost surface and patterned by photolithography. At this time, the first electrode 40 is patterned to have a shape illustrated in FIG. 2 in the planar view with respect to the substrate 10. Through the processing, the anode contact layer 24 and the first electrode 40 are electrically connected to each other via the via hole 301 at each of the sub-pixels SP. Further, as illustrated in FIG. 6C, at each of the sub-pixels SP, at least part of the edge of the first electrode 40 overlaps with the second portion 20b of the reflection layer 20. It can be said that, through this processing step, the first electrode 40 is formed in such a state that at least part of the edge of the first electrode 40 overlaps with the second portion 20b of the reflection layer 20. In addition, FIGS. 6B and 6C illustrate cross-sectional views of the same plane surface in the same processing step. Each of the cross-sectional views in FIG. 6B includes an end portion (one end portion) on the left side of the second portion 20b, and each of the cross-sectional views in FIG. 6C includes an end portion (another end portion) on the right side of the second portion 20b.

Figure 6D:
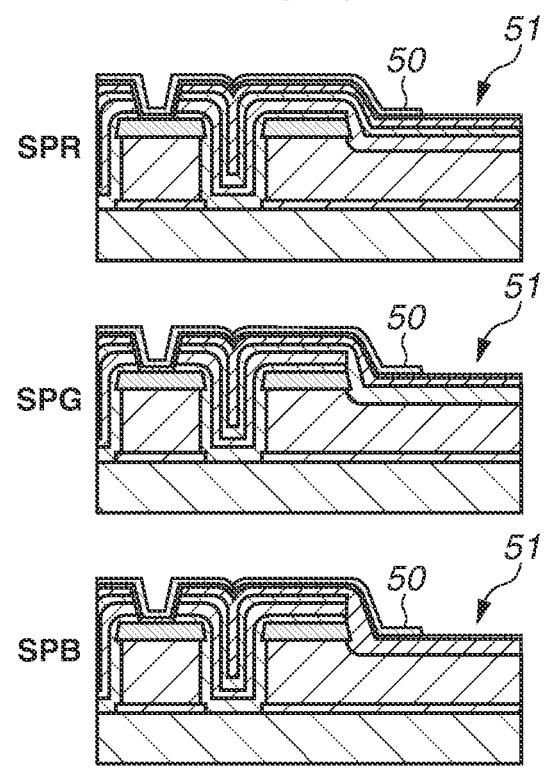

11. As illustrated in FIG. 6D, after a silicon oxide (SiOx) layer is deposited as the pixel separation film 50 through the CVD method on the entire uppermost surface, the opening 51 is formed on each of the sub-pixels SP by patterning the silicon oxide layer by photolithography. In the present exemplary embodiment, the opening 51 is formed into a circular shape concentric with the second portion 20b. However, a shape of the opening 51 is not limited thereto. A shape and a position of the opening 51 created in the sub-pixel SP may be changed depending on a position of the sub-pixel SP in the display area 101.

Figure 7A:
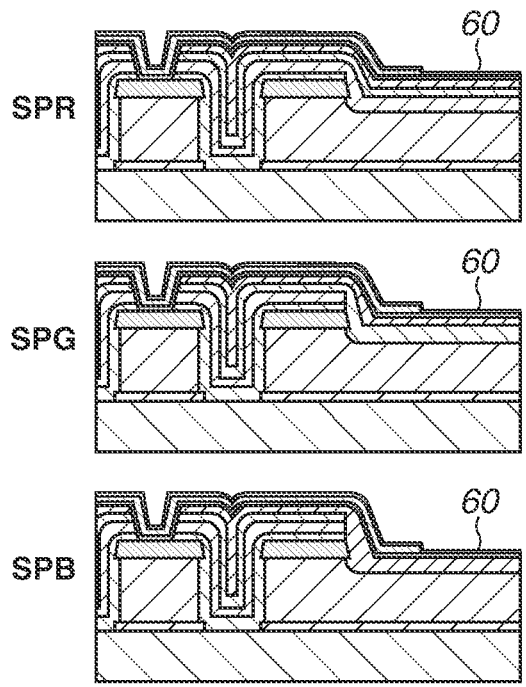
FIGS. 7A to 7D are schematic cross-sectional views of the light emitting apparatus in respective manufacturing processing steps according to the first exemplary embodiment.

12. As illustrated in FIG. 7A, the organic layer 60 is deposited on the entire uppermost surface through the vacuum vapor deposition method. In the present exemplary embodiment, the organic layer 60 has a structure in which a positive hole injection layer, a positive hole transport layer, a light emitting layer, an electron transport layer, and an electron injection layer are stacked in this order from a side of the substrate 10. Thus, these layers are deposited in sequence in this processing step. Herein, although the organic layer 60 is deposited on the entire uppermost surface (the entire surface of the display area 101), the present exemplary embodiment is not limited thereto. At least one layer from among the layers constituting the organic layer 60 may separately be deposited for each of pixels PX or each of sub-pixels SP. In a case where at least one layer from among the layers constituting the organic layer 60 is separately deposited for each of pixels PX or each of sub-pixels SP, it is preferable that deposition may be executed by using a shadow mask having an opening in an area where the layer is to be deposited.

Figure 7B:
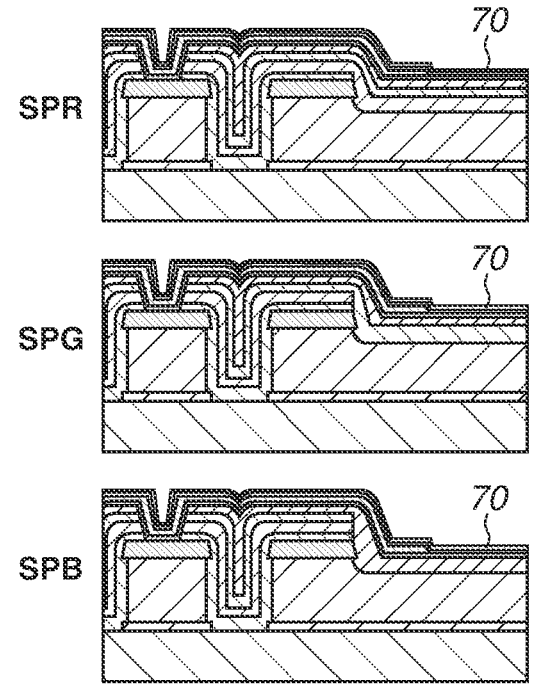

13. As illustrated in FIG. 7B, a magnesium-silver (Mg—Ag) layer is deposited as the second electrode 70 through the vacuum vapor deposition method on the entire uppermost surface.

Figure 7C:
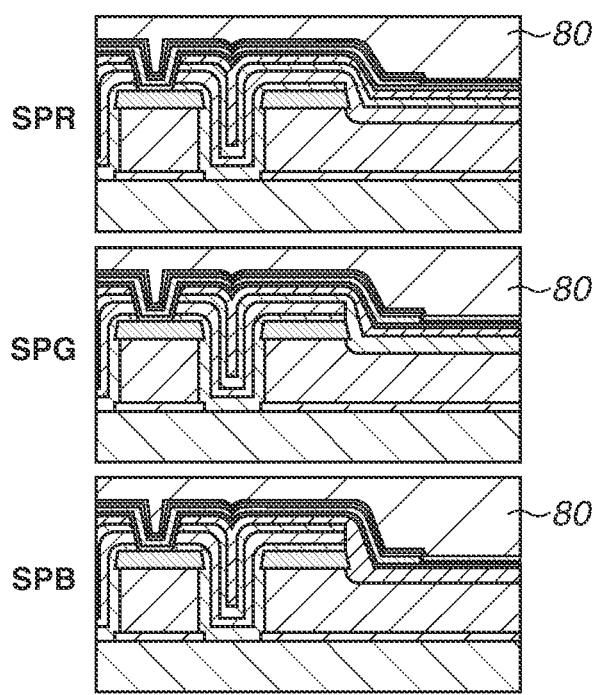
Figure 7D:
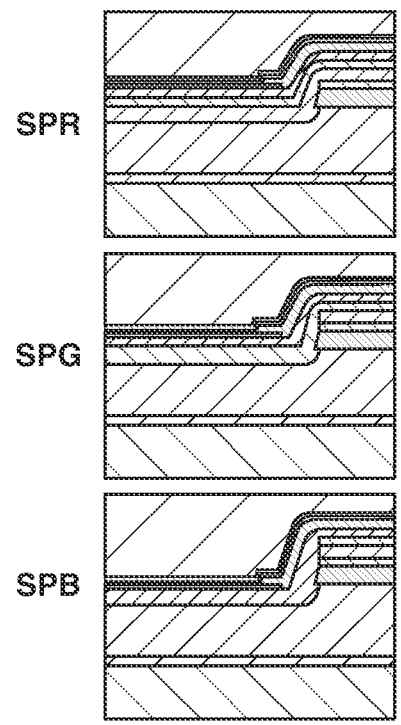

14. As illustrated in FIG. 7C, the sealing layer 80 is deposited on the entire uppermost surface. In the present exemplary embodiment, the sealing layer 80 has a structure in which a silicon nitride (SiNx) layer, an aluminum oxide (e.g., $Al_2O_3$) layer, and a silicon nitride (SiNx) are stacked in this order from a side of the substrate 10. First, the silicon nitride (SiNx) layer is deposited through the CVD method, and the aluminum oxide layer is deposited on top of the silicon nitride layer (SiNx) through the ALD method. Thereafter, the silicon nitride (SiNx) layer is further deposited on top of the aluminum oxide layer through the CVD method. FIG. 7D illustrates cross-sectional views of the plane surface in the processing step same as that of FIG. 7C, and each of the cross-sectional views includes an end portion (another end portion) on the right side of the second portion 20b. The relationship between FIGS. 7C and 7D is similar to the relationship between FIGS. 6B and 6C.

15. The planarization layer 91 is formed. With this processing, irregularities of the uppermost layer before the planarization layer 91 is formed is planarized.

16. The color filter layer 92 is formed. The color filter layer 92 includes the first color filter 92R, the second color filter 92G, and the third color filter 92B, so that the color filter layer 92 is formed by sequentially forming the first, second, and third color filters 92R, 92G, and 92B.

17. The planarization layer 93 is formed. With this processing, irregularities of the upper surface of the color filter layer 92 is planarized.

18. A plurality of microlenses 94 is formed. Each of the microlenses 94 is formed to correspond to each of the sub-pixels SP.

Through the above-described processing steps, a configuration illustrated in FIGS. 3A to 3C can be acquired.

A light emitting apparatus according to a second exemplary embodiment of the present disclosure will now be described with reference to FIG. 8 and FIGS. 9A to 9C. Hereinafter, a configuration different from the configuration described in the first exemplary embodiment will mainly be described.

Figure 8:
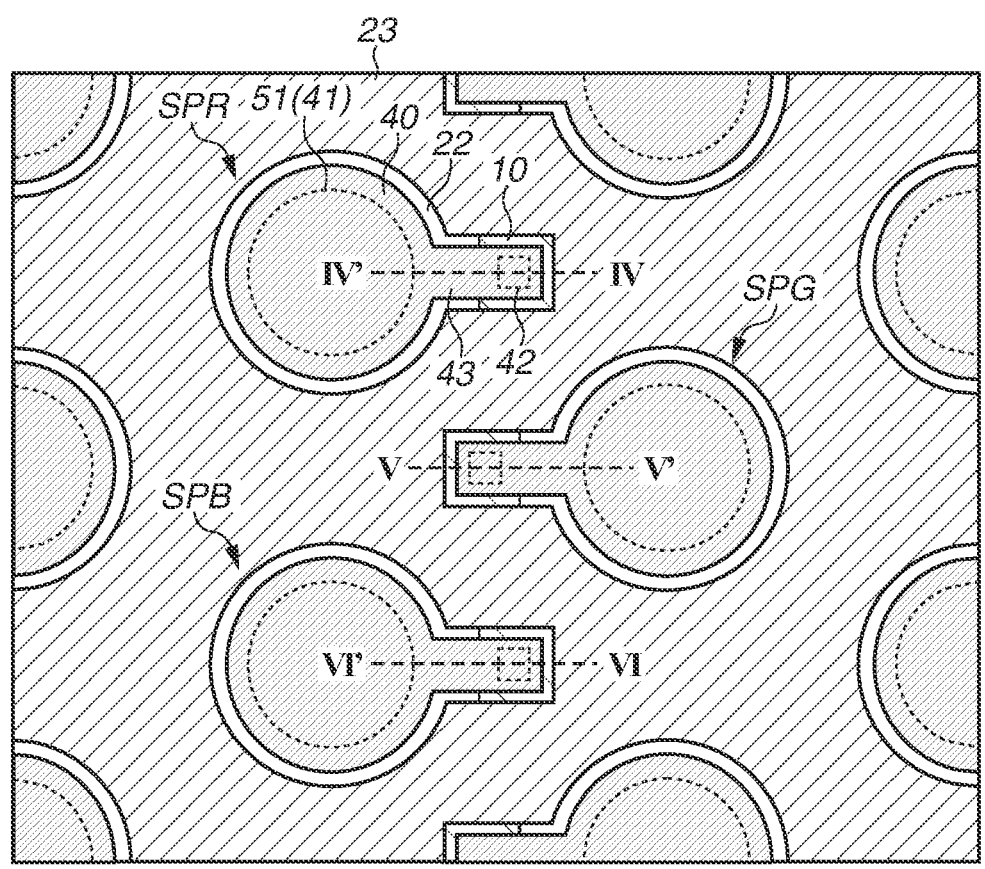
FIG. 8 is a planar view illustrating part of a display area of a light emitting apparatus according to a second exemplary embodiment.

FIG. 8 is a planar view illustrating an enlarged portion of the display area 101 of the light emitting apparatus of the present exemplary embodiment. An overall planar configuration (such as layout of the sub-pixels SP) of the light emitting apparatus is similar to that of the first exemplary embodiment. Similarly to FIG. 2, FIG. 8 illustrates a state where only part of layers which constitute a light emitting element arranged on each of the sub-pixels SP is seen through another part of the layers. Specifically, only the reflective metal layer 22, the barrier layer 23, the first electrode 40, and the substrate 10 are illustrated from among the layers which constitute the light emitting element.

Similarly to the first exemplary embodiment, in the present exemplary embodiment, the first electrode 40 also includes a substantially circular portion having a shape similar to the shape of the opening 51 of the pixel separation film 50 and an extending portion extending to the anode contact area from the substantially circular portion. In the first exemplary embodiment, the first portion 20a of the reflection layer 20 is arranged on the lower side of the extending portion (i.e., between the extending portion and the substrate 10). In contrast, in the present exemplary embodiment, the barrier layer 23 on the lower side of the extending portion is removed, so that the first portion 20a of the reflection layer 20 is not arranged on the lower side of the extending portion. Thus, the entire edge of the first electrode 40 is not arranged on the upper side of the first portion 20a.

Figure 9A:
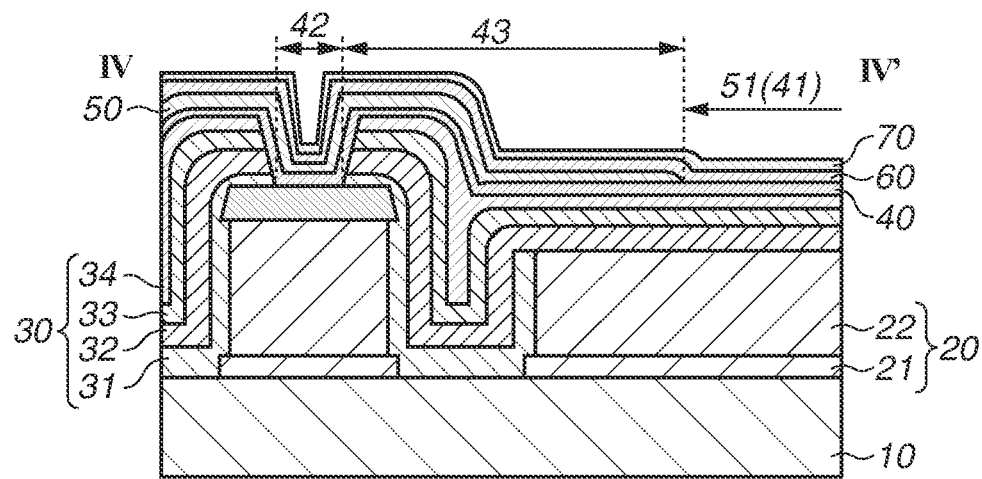
FIGS. 9A to 9C are cross-sectional views of a light emitting element included in the light emitting apparatus according to the second exemplary embodiment.
Figure 9B:
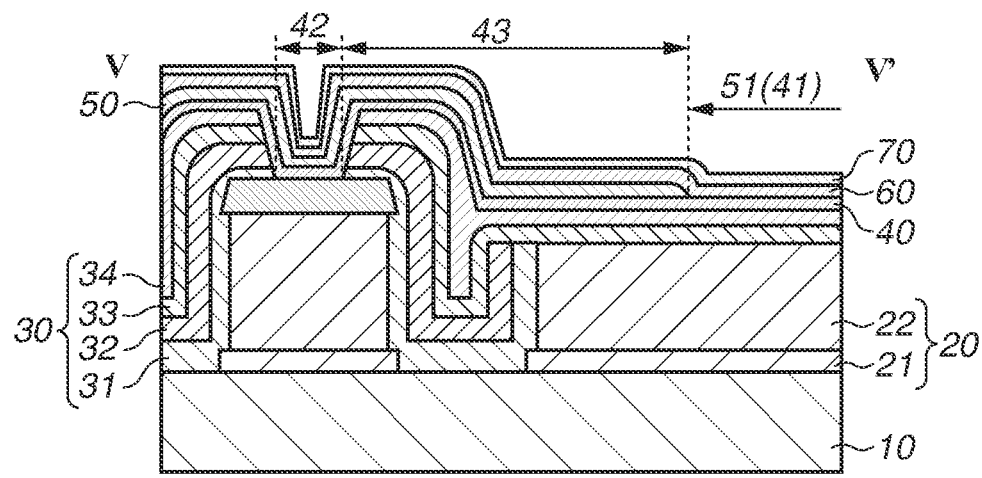
Figure 9C:
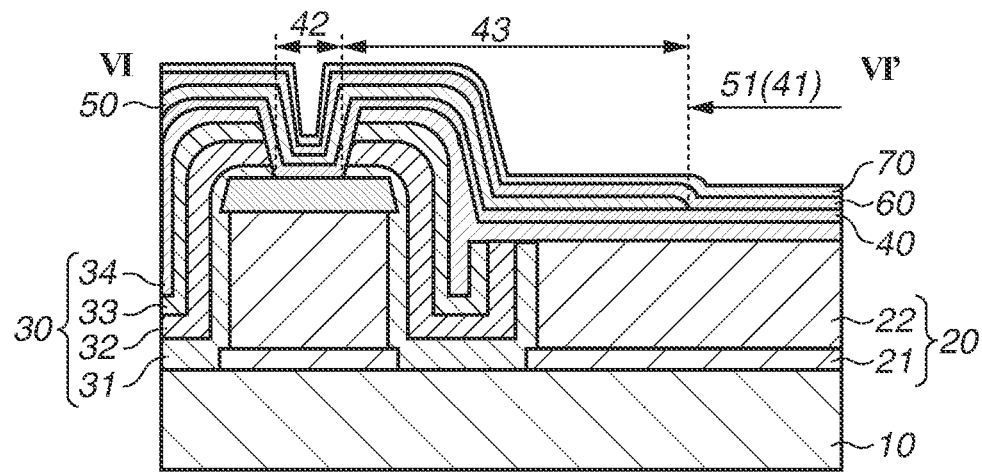

FIGS. 9A to 9C are cross-sectional views of the light emitting elements included in the light emitting apparatus according to the present exemplary embodiment. FIG. 9A illustrates a cross-sectional view of the light emitting element arranged on the first sub-pixel SPR. FIG. 9B illustrates a cross-sectional view of the light emitting element arranged on the second sub-pixel SPG. FIG. 9C illustrates a cross-sectional view of the light emitting element arranged on the third sub-pixel SPB. FIG. 9A is a cross-sectional view taken along a line IV-IV' illustrated in FIG. 8. FIG. 9B is a cross-sectional view taken along a line V-V' illustrated in FIG. 8. FIG. 9C is a cross-sectional view taken along a line VI-VI' illustrated in FIG. 8. As illustrated in FIGS. 9A to 9C, the first portion 20a of the reflection layer 20 existing in the lower side of the extending portion in the first exemplary embodiment is removed. Thus, a level difference existing in the light emitting area 41 and the contact area 42 caused by the first portion 20a is reduced in the present exemplary embodiment. As a result, current leakage occurring in the first electrode 40 and the second electrode 70 can be suppressed further.

In the processing step for removing the barrier layer 23 described in the first exemplary embodiment, the barrier layer 23 of an area including an area the first electrode 40 is arranged may be removed, so that the structure according to the present exemplary embodiment can be formed.

A light emitting apparatus according to a third exemplary embodiment of the present disclosure will now be described with reference to FIG. 10 and FIGS. 11A to 11C.

Hereinafter, a configuration different from the configuration described in the second exemplary embodiment will mainly be described.

Figure 10:
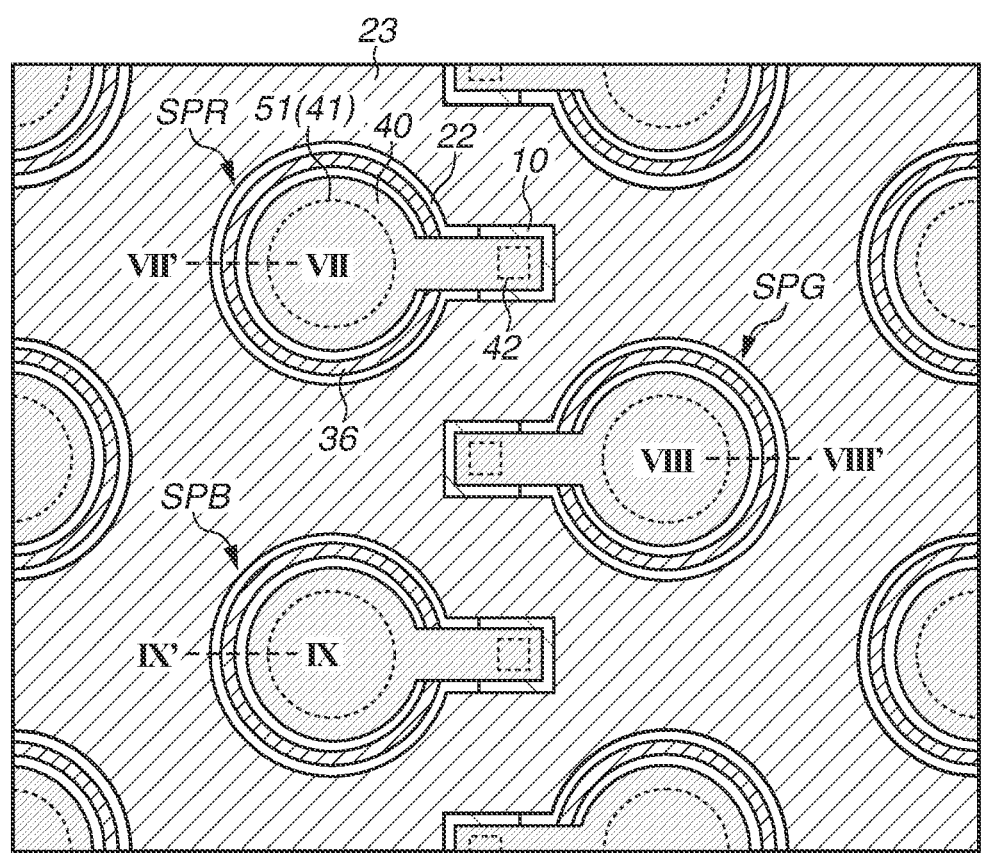
FIG. 10 is a planar view illustrating part of a display area of a light emitting apparatus according to a third exemplary embodiment.

FIG. 10 is a planar view illustrating an enlarged portion of the display area 101 of the light emitting apparatus of the present exemplary embodiment. An overall planar configuration (such as layout of the sub-pixels SP) of the light emitting apparatus is similar to that of the second exemplary embodiment. Similarly to FIG. 2, FIG. 10 illustrates a state where only part of layers which constitute a light emitting element arranged on each of the sub-pixels SP is seen through another part of the layers. Specifically, only the reflective metal layer 22, the barrier layer 23, the first electrode 40, the substrate 10, and the groove 36 are illustrated from among the layers which constitute the light emitting element.

In the present exemplary embodiment, a groove 36 is formed to surround the opening 51 on a surface as an underlay where the organic layer 60 is to be formed. In the present exemplary embodiment, the groove 36 is formed on the upper surface of the pixel separation film 50. The groove 36 is formed in an area between the first electrode 40 and the first portion 20a in a planar view. The groove 36 can be formed by partially etching and removing the third optical adjustment layer 34 existing in an area that surrounds the opening 51.

FIGS. 11A to 11C illustrate cross-sectional views of the light emitting elements included in the light emitting apparatus of the present exemplary embodiment. FIG. 11A illustrates a cross-sectional view of the light emitting element arranged on the first sub-pixel SPR. FIG. 11B illustrates a cross-sectional view of the light emitting element arranged on the second sub-pixel SPG. FIG. 11C illustrates a cross-sectional view of the light emitting element arranged on the third sub-pixel SPB. FIG. 11A is a cross-sectional view taken along a line VII-VII' illustrated in FIG. 10. FIG. 11B is a cross-sectional view taken along a line VIII-VIII' illustrated in FIG. 10. FIG. 11C is a cross-sectional view taken along a line IX-IX' illustrated in FIG. 10. As illustrated in FIGS. 11A to 11C, the groove 36 is formed on a surface as an underlay where the organic layer 60 is to be formed, in the present exemplary embodiment. Thus, a film thickness of the organic layer 60 formed on the upper side of the groove 36 can be reduced in a periphery of the groove 36. With this configuration, electric resistance of the organic layer 60 in this portion can be increased, so that mobility of carriers, such as an electron and a hole, can be lowered. As a result, a flow of carriers moving into the adjacent sub-pixels SP via the organic layer 60 (also called "inter-pixel leakage) can be suppressed. If the inter-pixel leakage occurs, light emission also occurs in the adjacent pixels SP. This is not preferable because light emission occurs unintentionally. In the present exemplary embodiment, the inter-pixel leakage is suppressed by forming the groove 36. Accordingly, color purity and quality levels of emitted light and display colors can be improved.

In the present exemplary embodiment, the groove 36 is formed on a surface as an underlay where the organic layer 60 is to be formed by partially removing the third optical adjustment layer 34. However, the present exemplary embodiment is not limited thereto. Even if the groove 36 is not formed on the third optical adjustment layer 34, the same effect can also be acquired by sufficiently increasing a horizontal distance D between the edge of the first electrode 40 and the first portion 20a (i.e., a distance in a direction parallel to a main surface of the substrate 10). The horizontal distance D may be set to be greater than, for example, a total of a film thickness t1 of the first optical adjustment layer 32, a film thickness t2 of the second optical adjustment layer 33, a film thickness t3 of the third optical adjustment layer 34, and twice a film thickness tp of the pixel separation film 50. In other words, a condition $D>(t1+t2+t3+2tp)$ may be satisfied.

Further, it is preferable that a height of the upper surface of the pixel separation film 50 at a portion where the groove 36 is formed be lower than a height of the upper surface of the first electrode 40 arranged on the upper side of the second portion 20b. With this configuration, a steep level difference can be created at the groove 36, so that an effect of reducing the film thickness of the organic layer 60 can be improved. Further, a level difference between the upper surface of the pixel separation film 50 arranged on the upper side of the first electrode 40 and the upper surface of the first electrode 40 also has a beneficial effect on reducing a film thickness of the organic layer 60. It is therefore preferable that the pixel separation film 50 have a thickness 0.5 times or more and two times or less than a thickness of the first electrode 40.

A light emitting apparatus according to a fourth exemplary embodiment of the present disclosure will now be described with reference to FIGS. 12A and 12B. Hereinafter, a configuration different from the configuration described in the first or the second exemplary embodiment will be mainly described.

Figure 12A:
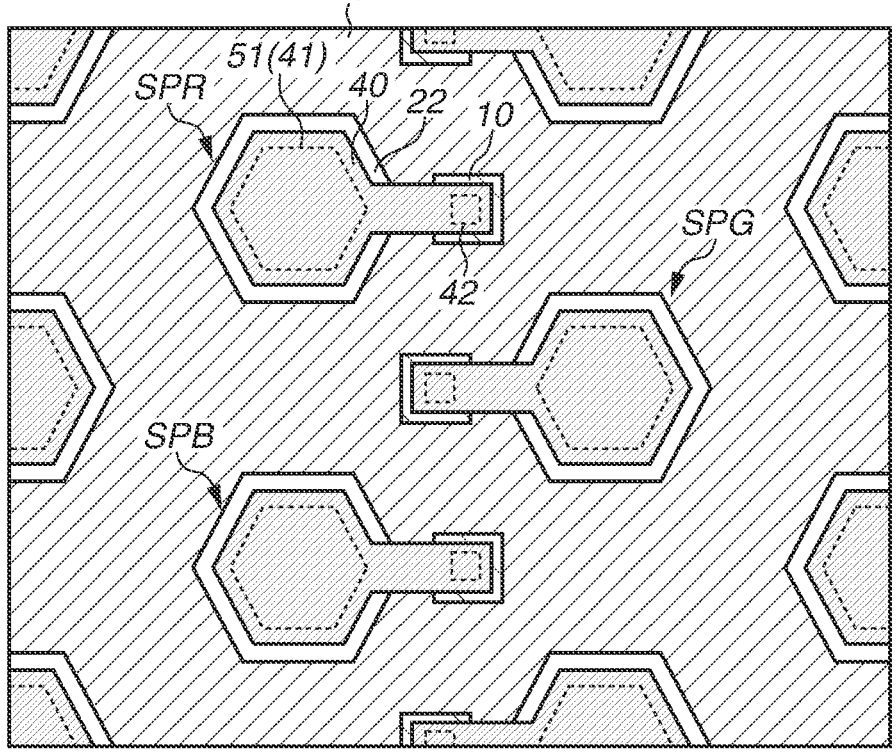
FIGS. 12A and 12B are planar views illustrating part of a display area of a light emitting apparatus according to a fourth exemplary embodiment.

FIG. 12A is a planar view illustrating an enlarged portion of the display area 101 of the light emitting apparatus of the present exemplary embodiment. An overall planar configuration (such as layout of the sub-pixels SP) of the light emitting apparatus is similar to that of the first exemplary embodiment.

In the present exemplary embodiment, a shape of the second portion 20b of the reflection layer 20 and a shape of the opening 51 in the planar view is different from the shapes described in the first exemplary embodiment. In the first exemplary embodiment, the opening 51 of the pixel separation film 50 and the second portion 20b of the reflection layer 20 have circular shapes in the planar view with respect to the substrate 10, as described above. In contrast in the present exemplary embodiment, both of the opening 51 and the second portion 20b have hexagonal shapes, as illustrated in FIG. 12A. The first electrode 40 arranged on the upper side of the light emitting area 41 also has a hexagonal shape in the planar view. By forming the second portion 20b of the reflection layer 20 into a hexagonal shape as described above, density of sub-pixels SP arranged in the display area 101 can be increased, particularly when the sub-pixels SP are arranged in a delta array. An opening ratio of the sub-pixel SP can also be increased by forming the opening 51 into the hexagonal shape.

Figure 12B:
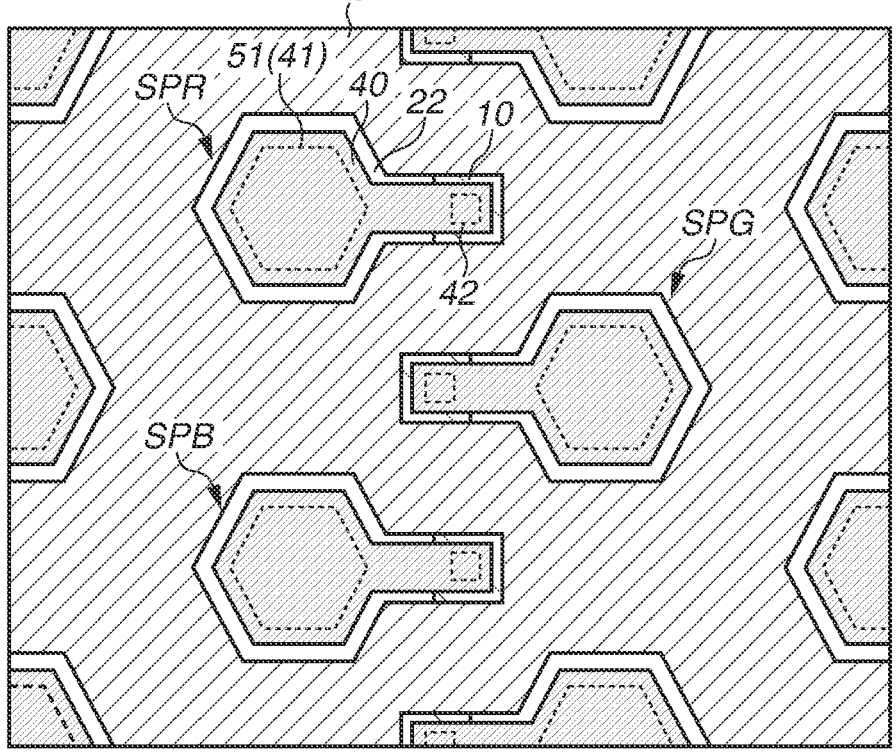

FIG. 12B is a planar view illustrating an enlarged portion of another example of the display area 101 of the light emitting apparatus according to the present exemplary embodiment. An overall planar configuration (such as layout of the sub-pixels SP) of the light emitting apparatus is similar to that of the second exemplary embodiment. As illustrated in FIG. 12B, the barrier layer 23 on the lower side of the extending portion of the first electrode 40 is removed from the configuration illustrated in FIG. 12A, similarly to the configuration described in the second exemplary embodiment. In other words, the first portion 20a of the reflection layer 20 is not arranged on the lower side of the extending portion of the first electrode 40 in this example. With this configuration, current leakage occurring in the first electrode 40 and the second electrode 70 can be suppressed further similarly to the second exemplary embodiment.

A light emitting apparatus according to a fifth exemplary embodiment of the present disclosure will now be described with reference to FIGS. 13A and 13B. Hereinafter, a configuration different from the configuration described in the fourth exemplary embodiment will be mainly described.

Figure 13A:
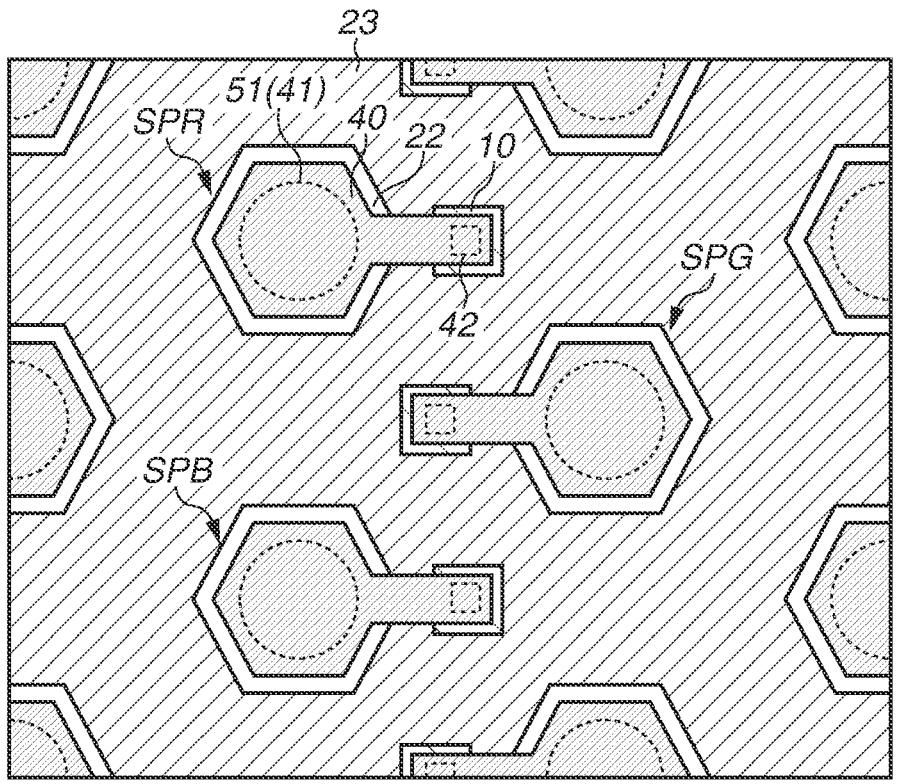
FIGS. 13A and 13B are planar views illustrating part of a display area of a light emitting apparatus according to a fifth exemplary embodiment.
Figure 13B:
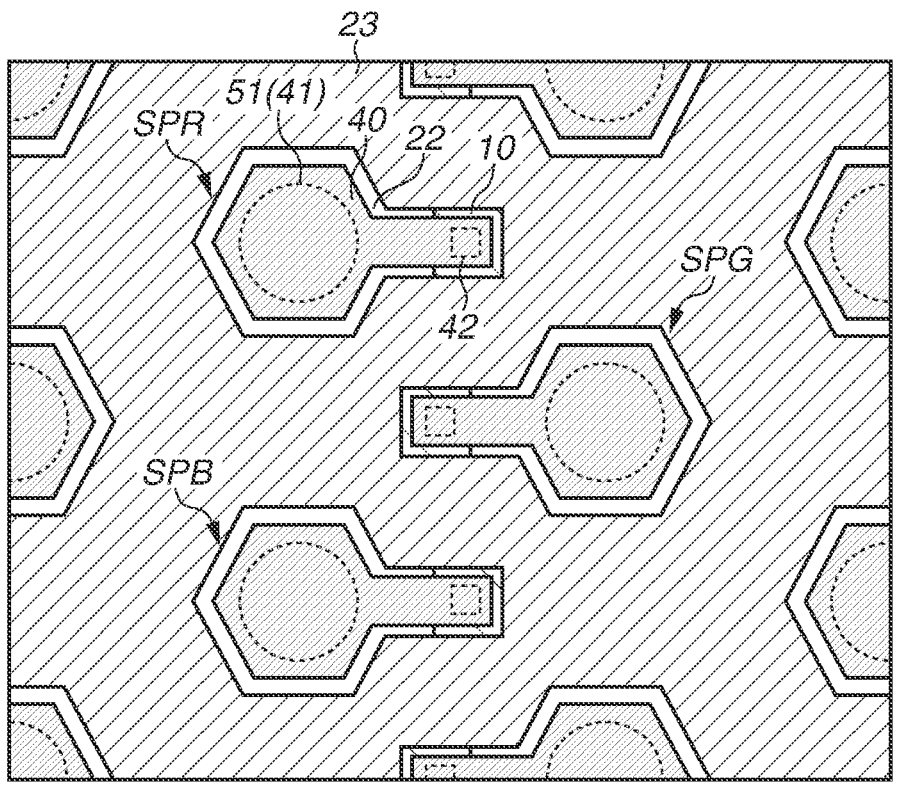

FIGS. 13A and 13B are planar views illustrating an enlarged portion of the display area 101 of the light emitting apparatus of the present exemplary embodiment. An overall planar configuration (such as layout of the sub-pixels SP) of the light emitting apparatus is similar to that of the fourth exemplary embodiment.

In the present exemplary embodiment, a shape of the opening 51 of the pixel separation film 50 in a planar view is different from the shape described in the fourth exemplary embodiment. In the fourth exemplary embodiment, the opening 51 of the pixel separation film 50 has a hexagonal shape similarly to the shape of the second portion 20b of the reflection layer 20 as described above. In contrast in the present exemplary embodiment, the opening 51 of the pixel separation film 50 has a circular shape, even though the second portion 20b of the reflection layer 20 has a hexagonal shape as illustrated in FIG. 13A.

A light emitting apparatus according to a sixth exemplary embodiment of the present disclosure will now be described with reference to FIGS. 14A, 14B, and 15.

Hereinafter, a configuration different from the configuration described in the fifth exemplary embodiment will be mainly described.

Figure 14A:
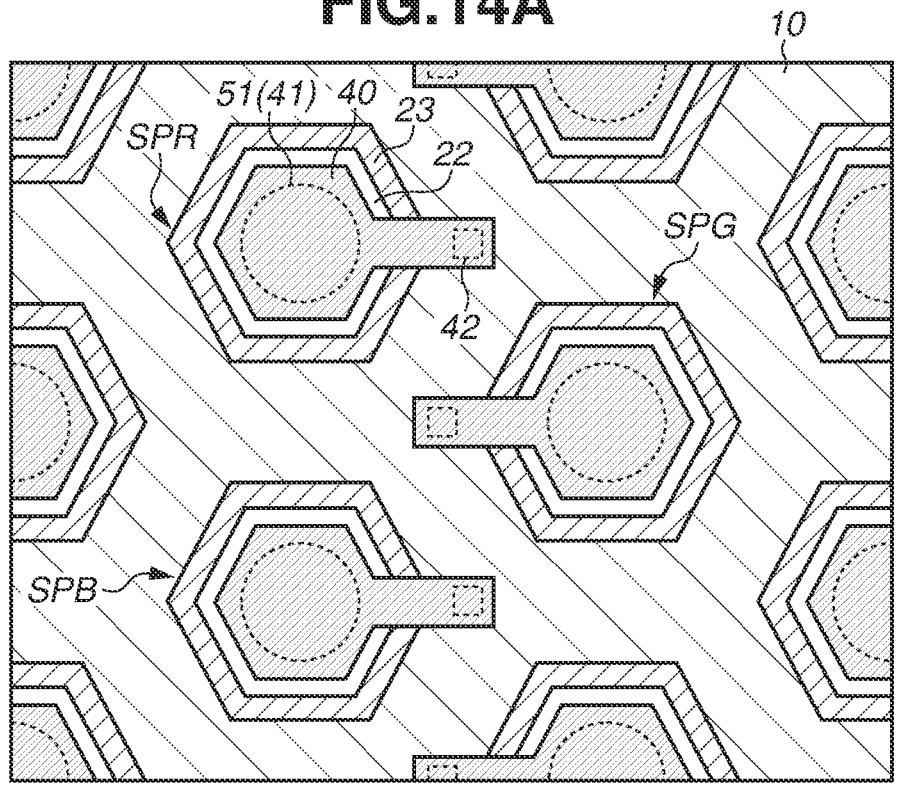
FIGS. 14A and 14B are planar views illustrating part of a display area of a light emitting apparatus according to a sixth exemplary embodiment.
Figure 14B:
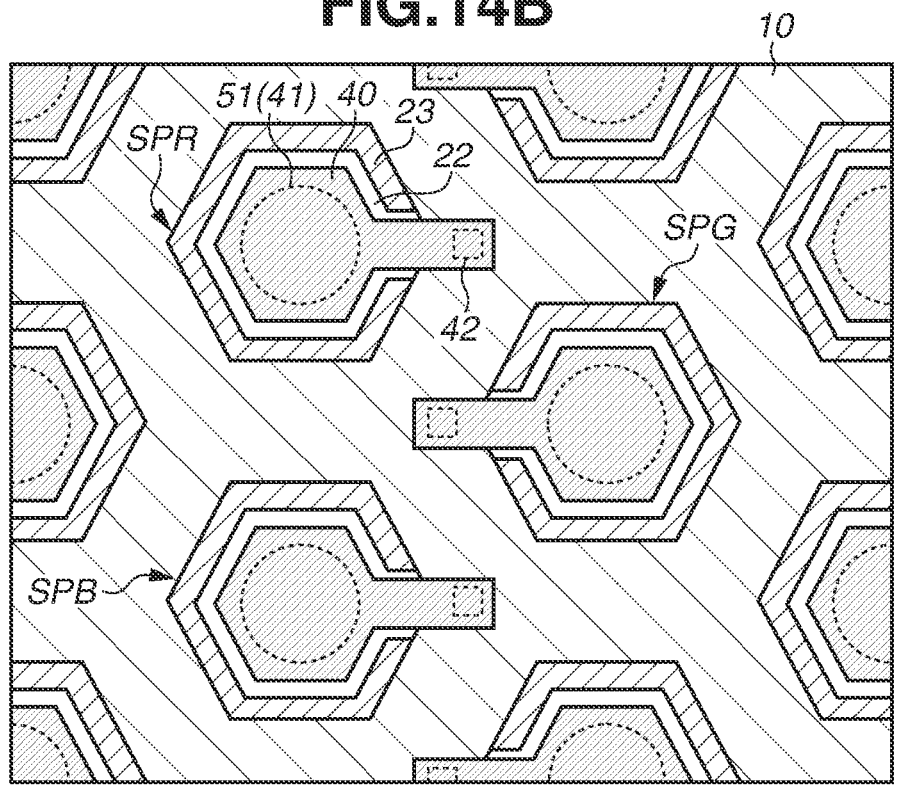

FIGS. 14A and 14B are planar views illustrating an enlarged portion of the display area 101 of the light emitting apparatus of the present exemplary embodiment. An overall planar configuration (such as layout of the sub-pixels SP) of the light emitting apparatus is similar to that of the fifth exemplary embodiment.

In each of the first to fifth exemplary embodiments, the reflection layer 20 is continuously arranged over a plurality of sub-pixels SP. However, in the present exemplary embodiment, the reflection layer 20 is independently arranged for each of the sub-pixels SP. By electrically separating the reflection layer 20 for each of the sub-pixels SP, potential of the reflection layer 20 can be controlled for each of the sub-pixels SP independently. By independently controlling the potential of the reflection layer 20 for each of the sub-pixels SP, occurrence of crosstalk can be reduced, so that a quality level of light emitted from the light emitting element and the light emitting apparatus can be improved.

Figure 15:
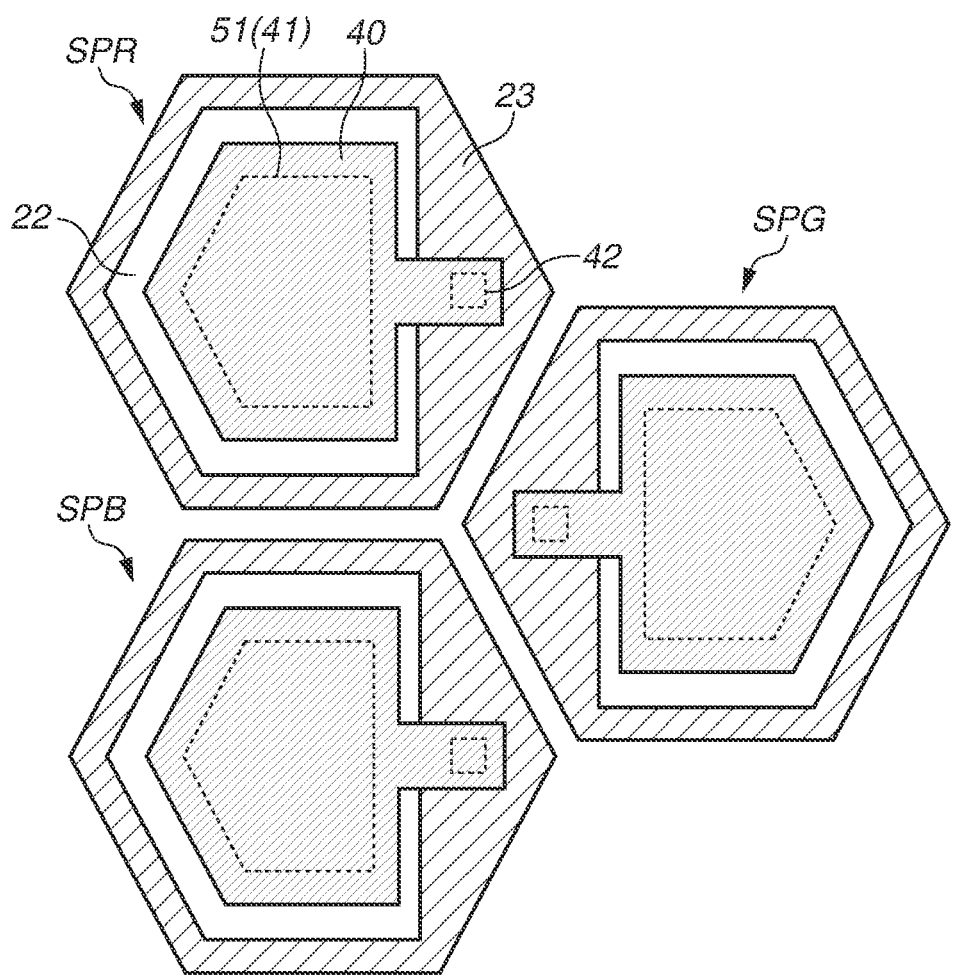
FIG. 15 is a planar view illustrating part of a display area of the light emitting apparatus according to a variation example of a sixth exemplary embodiment.

FIG. 15 illustrates a variation example of the configuration illustrated in FIG. 14A. By forming the respective elements of the sub-pixels SP into shapes illustrated in FIG. 15, the sub-pixels SP can be arranged at high density.

Figure 16:
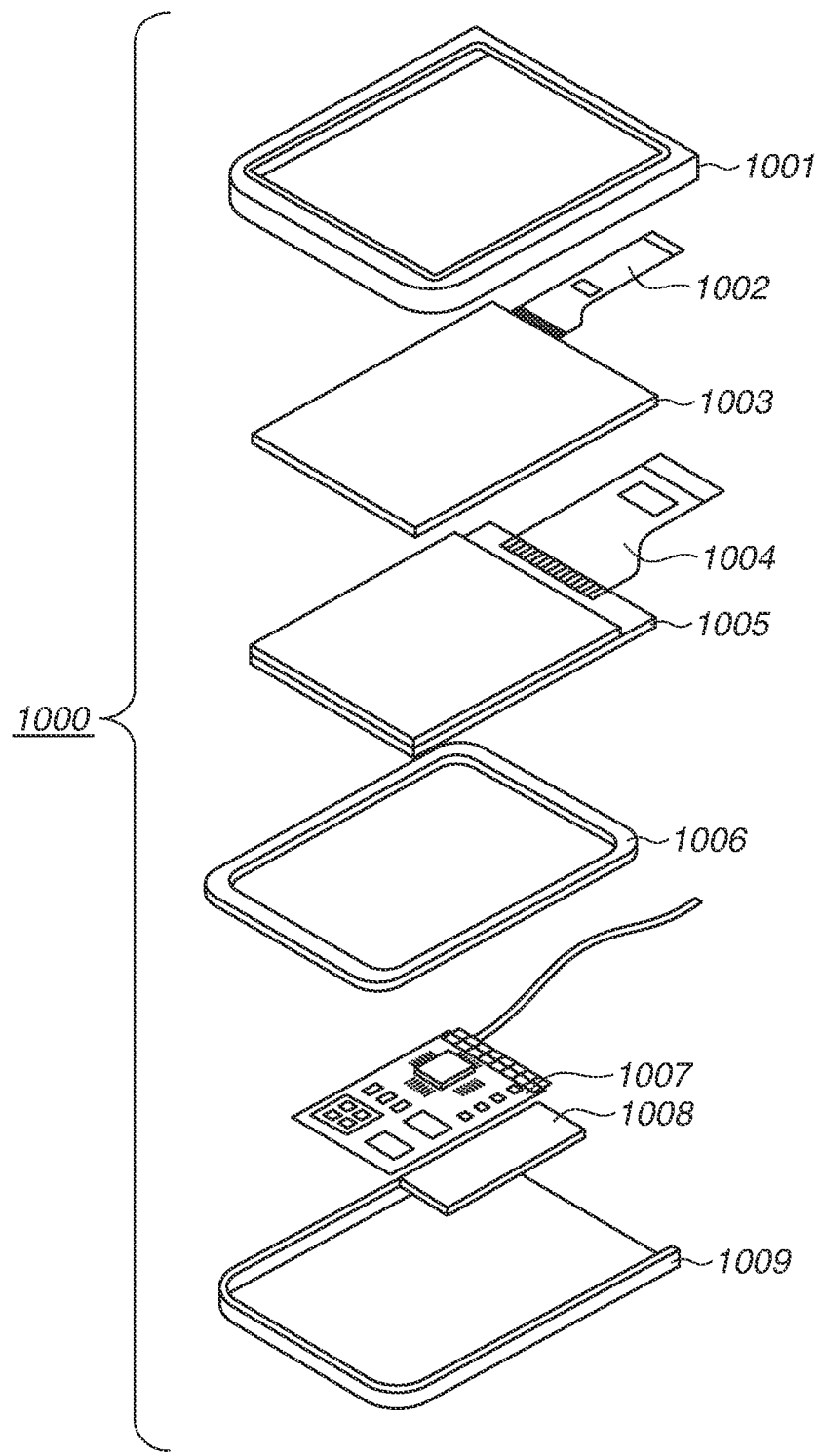
FIG. 16 is a schematic diagram illustrating an example of a display apparatus.

FIG. 16 is a schematic diagram illustrating an example of a display apparatus 1000 according to another exemplary embodiment. The display apparatus 1000 may include a touch panel 1003, a display panel 1005, a frame 1006, a circuit substrate 1007, and a battery 1008 arranged between an upper cover 1001 and a lower cover 1009. The light emitting apparatus according to any one of the above-described exemplary embodiments can be used as the display panel 1005.

A flexible printed circuit FPC 1002 and a flexible printed circuit FPC 1004 are connected to the touch panel 1003 and the display panel 1005, respectively. A transistor is printed on the circuit substrate 1007. If the display apparatus 1000 is not a mobile device, the battery 1008 may not be arranged thereon. Even if the display apparatus 1000 is a mobile device, the battery 1008 can be arranged separately.

The display apparatus 1000 according to the present exemplary embodiment may be used for a display unit of a photoelectric conversion apparatus including an optical unit having a plurality of lenses and an image sensor for receiving light passing through the optical unit.

The photoelectric conversion apparatus may have a display unit for displaying information acquired by the image sensor. Further, the photoelectric conversion apparatus may acquire information by using the information acquired by the image sensor, and the display unit may display information different from that information. The display unit may be exposed to the outside of the photoelectric conversion apparatus, or may be arranged inside the viewfinder. The photoelectric conversion apparatus may be a digital camera or a digital video camera.

Figure 17A:
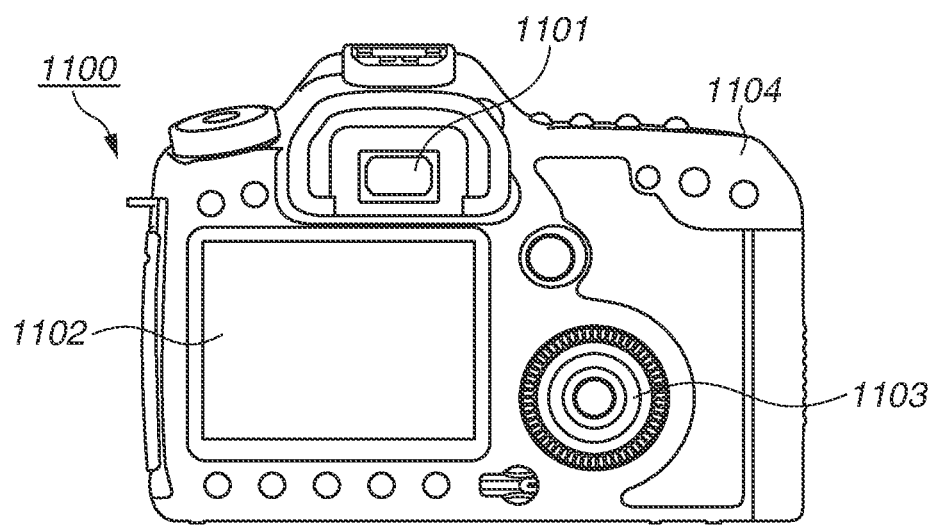
FIG. 17A is a schematic diagram illustrating an example of a photoelectric conversion apparatus.

FIG. 17A is a schematic diagram illustrating an example of the photoelectric conversion apparatus according to the present exemplary embodiment. A photoelectric conversion apparatus 1100 may include a viewfinder 1101, a back face display 1102, an operation unit 1103, and a housing 1104. The viewfinder 1101 may include any one of the light emitting apparatuses according to the above-described exemplary embodiments. The viewfinder 1101 may also be the display apparatus 1000 described in the present exemplary embodiment. In this case, the display apparatus 1000 may display environmental information or image capturing instructions in addition to an image to be captured. The environmental information may include information about intensity and a direction of outside light, information about moving speed of an object, and information about a possibility of an object being covered or hidden by a shielding object.

The photoelectric conversion apparatus 1100 includes an optical unit (not illustrated). The optical unit includes a plurality of lenses, and forms an image on an image sensor housed within the housing 1104. The plurality of lenses can execute focus adjustment by adjusting relative positions thereof. This operation can be executed automatically.

The display apparatus according to the present exemplary embodiment can be used for a display unit of a mobile terminal. In this case, the display apparatus may have both a display function and an operation function. A mobile phone such as a smartphone, a tablet terminal, and a head-mounted display are examples of the mobile terminal.

Figure 17B:
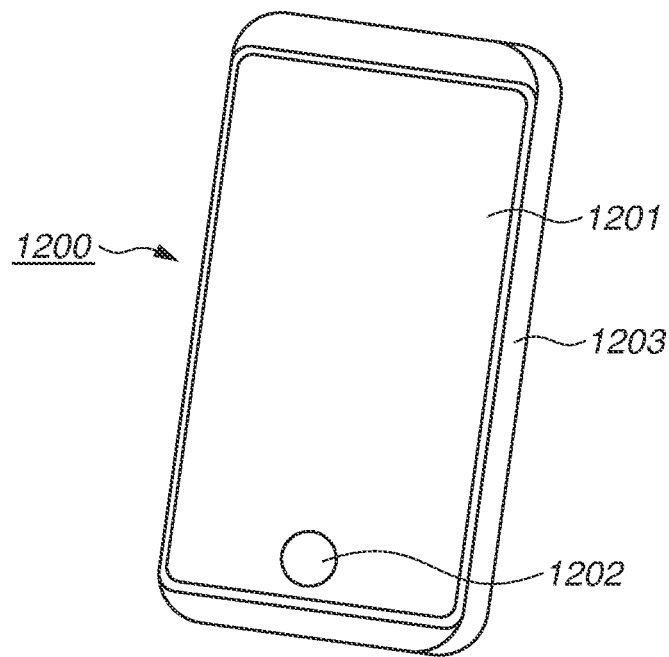
FIG. 17B is a schematic diagram illustrating an example of an electronic device.

FIG. 17B is a schematic diagram illustrating an example of an electronic device according to the present exemplary embodiment. An electronic device 1200 includes a display unit 1201, an operation unit 1202, and a housing 1203. The display unit 1201 may include any one of the light emitting apparatuses according to the above-described exemplary embodiments. The housing 1203 may include a circuit, a printed substrate having the circuit, a battery, and a communication unit. The operation unit 1202 may be a button, or may be a touch panel-type reaction unit. The operation unit 1202 may be a biometric recognition unit that recognizes a fingerprint to release a lock. It can be said that the electronic device 1200 having a communication unit is a communication device.

Figure 18A:
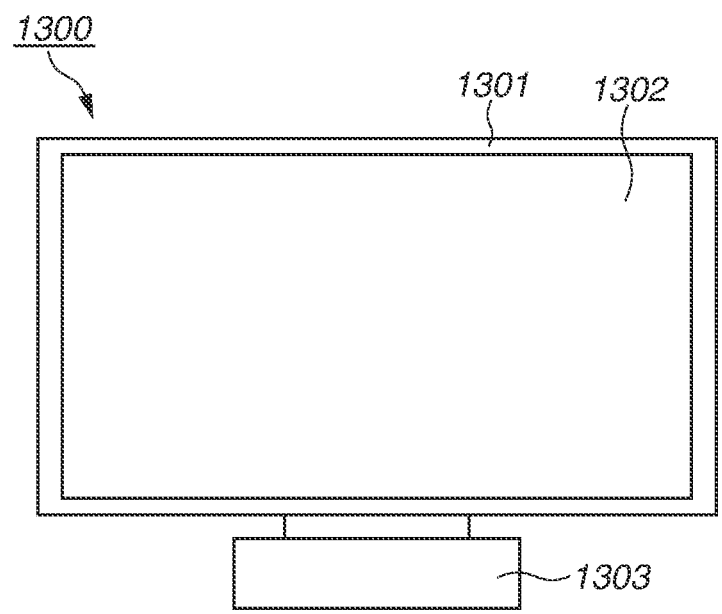
FIG. 18A is a schematic diagram illustrating an example of a display apparatus.
Figure 18B:
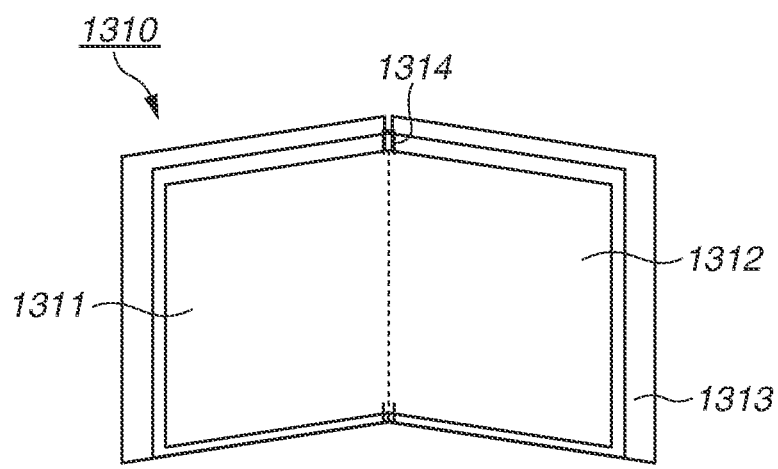
FIG. 18B is a schematic diagram illustrating an example of a foldable display apparatus.

FIGS. 18A and 18B are schematic diagrams illustrating examples of the display apparatus according to the present exemplary embodiment. FIG. 18A illustrates a display apparatus 1300 such as a TV monitor or a PC monitor. The display apparatus 1300 includes a frame 1301 and a display unit 1302. The display unit 1302 may include any one of the light emitting apparatuses according to the above-described exemplary embodiments.

The display apparatus 1300 includes the frame 1301 and a base 1303 which supports the display unit 1302. The base 1303 does not always have to have a configuration illustrated in FIG. 18A. A lower side of the frame 1301 may also function as a base.

Further, each of the frame 1301 and the display unit 1302 may have a curved shape. A curvature radius thereof may be 5000 mm or more and 6000 mm or less.

FIG. 18B is a schematic diagram illustrating another example of the display apparatus according to the present exemplary embodiment. A display apparatus 1310 illustrated in FIG. 18B is a so-called foldable display apparatus capable of being folded. The display apparatus 1310 includes a first display unit 1311, a second display unit 1312, a housing 1313, and a folding point 1314. Each of the first display unit 1311 and the second display unit 1312 may include any one of the light emitting apparatuses according to the above-described exemplary embodiments.

The first display unit 1311 and the second display unit 1312 may be a single seamless display apparatus. The first display unit 1311 and the second display unit 1312 can be separated at the folding point 1314.

The first display unit 1311 and the second display unit 1312 may display different images, or may display one image.

Figure 19A:
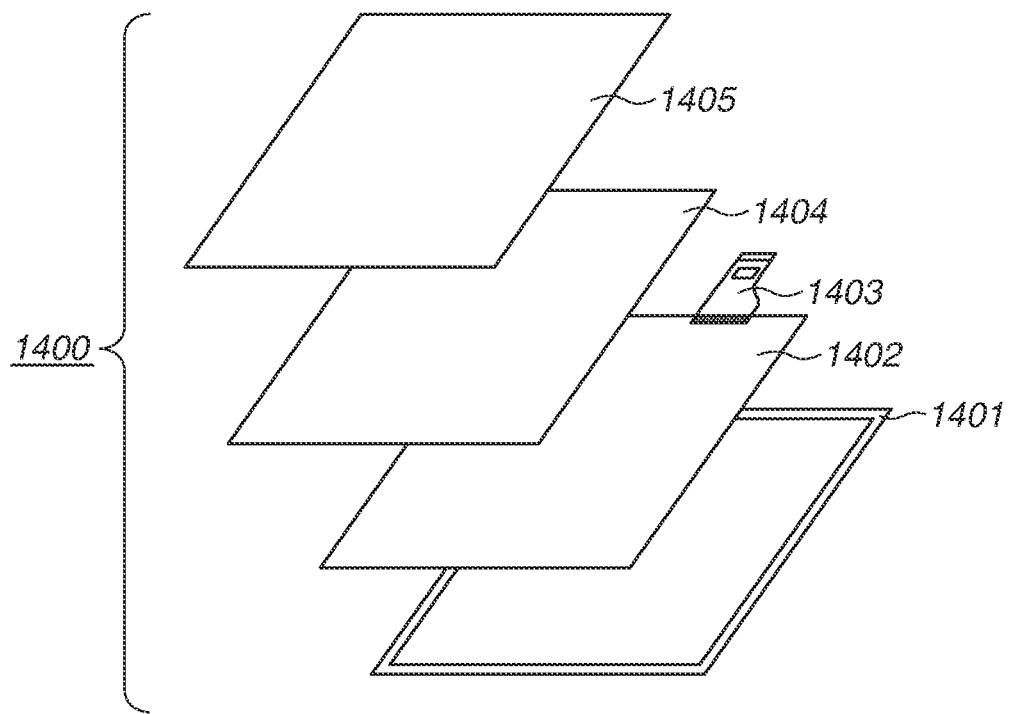
FIG. 19A is a schematic diagram illustrating an example of an illumination apparatus.

FIG. 19A is a schematic diagram illustrating an example of an illumination apparatus according to the present exemplary embodiment. An illumination apparatus 1400 includes a housing 1401, a light source 1402, a circuit substrate 1403, an optical filter 1404, and a light diffusion unit 1405. The light source 1402 may include any one of the light emitting apparatuses according to the above-described exemplary embodiments. The optical filter 1404 may be a filter which improves a color rendering property of the light source 1402. The light diffusion unit 1405 effectively diffuses light of the light source 1402 to light up a wide area by delivering light thereto. The optical filter 1404 and the light diffusion unit 1405 may be arranged on a light emitting side of the illumination apparatus 1400. The illumination apparatus 1400 may also have a cover arranged on an outermost portion thereof if necessary.

For example, the illumination apparatus 1400 is an apparatus for illuminating a room. The illumination apparatus 1400 may emit light of various colors such as white, daylight white, or any color from blue to red. The illumination apparatus 1400 may include a light adjustment circuit for adjusting the light of respective colors.

The illumination apparatus 1400 may include any one of the light emitting apparatuses according to the above-described exemplary embodiments and a power circuit connected thereto. The power circuit is a circuit for converting alternate current into direct current. Further, white light is light having a color temperature of 4200 K, and daylight white light is light having a color temperature of 5000 K. The illumination apparatus 1400 may include a color filter.

The illumination apparatus 1400 according to the present exemplary embodiment may also include a heat dissipation unit. The heat dissipation unit consists of a material, such as a metal of high specific heat or a liquid silicon, and dissipates heat generated inside the illumination apparatus 1400 to the outside thereof.

Figure 19B:
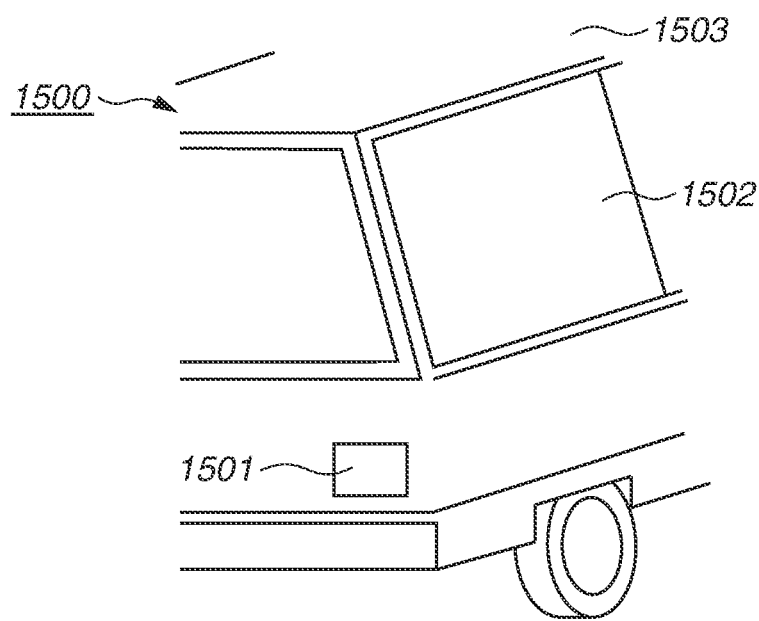
FIG. 19B is a schematic diagram illustrating an example of an automobile having an automotive lamp unit.

FIG. 19B is a schematic diagram of an automobile 1500 as one example of a moving body according to the present exemplary embodiment. The automobile 1500 includes a tail lamp 1501 as one example of a lamp unit. The automobile 1500 includes the tail lamp 1501, and turns on the tail lamp 1501 when a brake is operated.

The tail lamp 1501 may include any one of the light emitting apparatuses according to the above-described exemplary embodiments.

The tail lamp 1501 may include a protection member for protecting a light emitting element. Although any transparent materials having a certain degree of strength can be used for the protection member, it is preferable that the protection member be made of a material such as polycarbonate. A derivative of furandi-carboxylic acid or an acrylonitrile derivative may be mixed with the polycarbonate.

The automobile 1500 includes a car body 1503 and a window 1502 mounted thereon. The window 1502 can be a transparent display unless the window 1502 is used for checking a front side or a rear side of the automobile 1500. The transparent display may include any one of the light emitting apparatuses according to the above-described exemplary embodiments. In this case, constituent elements, such as electrodes included in the light emitting apparatus, are made of a transparent material.

The moving body according to the present exemplary embodiment may be an ocean vessel, an aircraft, or a drone. The moving body may include a body and a lamp unit mounted on the body. The lamp unit may emit light in order to show a location of the body. The lamp unit may include any one of the light emitting apparatuses according to the above-described exemplary embodiments.

An application example of the display apparatus according to the above-described exemplary embodiments will now be described with reference to FIGS. 20A and 20B. The display apparatus can be applied to a system which the user can wear as a wearable device, such as smart-glasses, a head-mounted display (HMD), and smart-contact lenses. An image capturing display apparatus used for the above-described application example includes an image capturing apparatus capable of photoelectrically converting visible light and a display apparatus capable of emitting visible light.

Figure 20A:
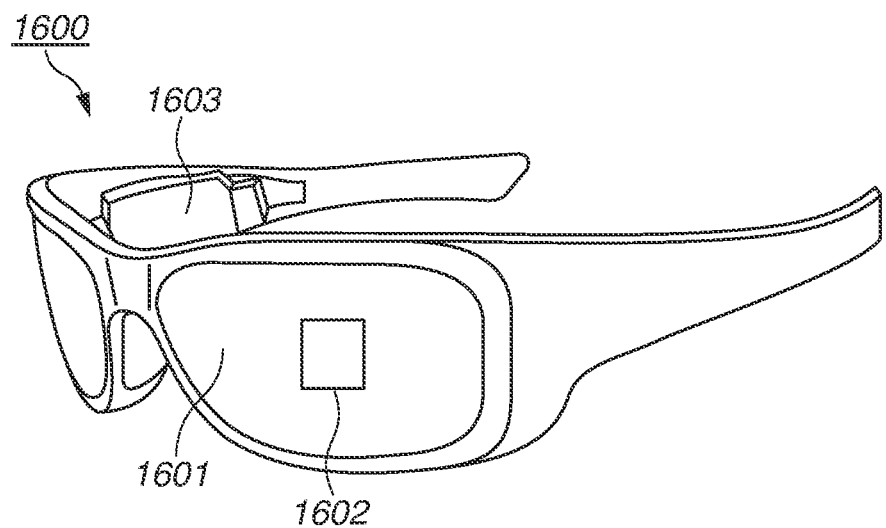
FIG. 20A is a schematic diagram illustrating an example of a wearable device.

FIG. 20A illustrates eyeglasses 1600 (smart-glasses) as one application example. An image capturing apparatus 1602 such as a complementary metal-oxide semiconductor (CMOS) sensor or a single-photon avalanche diode (SPAD) sensor is mounted on a side of a front surface of each of lenses 1601 mounted on the eyeglasses 1600. Further, a display apparatus is arranged on a side of a rear surface of each of the lenses 1601, and the display apparatus may include any one of the light emitting apparatuses according to the above-described exemplary embodiments.

The eyeglasses 1600 further includes a control apparatus 1603. The control apparatus 1603 functions as a power supply that supplies power to the image capturing apparatus 1602 and the display apparatus according to the present exemplary embodiment. The control apparatus 1603 also controls operations of the image capturing apparatus 1602 and the display apparatus. An optical system for focusing light to the image capturing apparatus 1602 is formed on each of the lenses 1601.

Figure 20B:
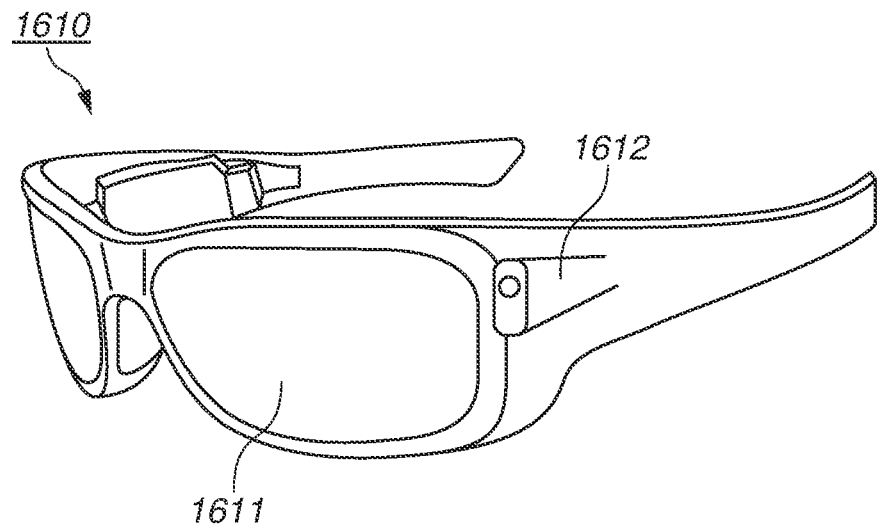
FIG. 20B is a schematic diagram illustrating an example of a wearable device including an image capturing apparatus.

FIG. 20B illustrates eyeglasses 1610 (smart-glasses) as one application example. The eyeglasses 1610 includes a control apparatus 1612 on which an image capturing apparatus corresponding to the image capturing apparatus 1602 and a display apparatus are mounted. The display apparatus may include any one of the light emitting apparatuses according to the above-described exemplary embodiments. An optical system for projecting light emitted from the display apparatus included in the control apparatus 1612 is formed on each of lenses 1611, so that an image is projected on each of the lenses 1611. The control apparatus 1612 functions as a power supply which supplies power to the image capturing apparatus and the display apparatus, and also controls the operations of the image capturing apparatus and the display apparatus. The control apparatus 1612 may include a line-of-sight detection unit for detecting a line-of-sight of a user. Infrared light may be used for detecting the line-of-sight. An infrared light emitting unit emits infrared light to the eyeballs of the user gazing at a displayed image. An image capturing unit having a light receiving element detects the emitted infrared light reflected on the eyeball, so that a captured image of the eyeball can be acquired. The eyeglasses 1610 may also include a reduction unit for reducing light emitted to a display unit from the infrared light emitting unit in a planar view. With this configuration, lowering of image quality can be reduced.

The user's line-of-sight with respect to a displayed image is detected from a captured image of the eyeball acquired from the captured infrared light. An optional known method can be used for the line-of-sight detection using a captured image of the eyeball. For example, a line-of-sight detection method based on a reflected image, known as "Purkinje image", acquired from irradiation light reflected on the cornea can be used.

More specifically, line-of-sight detection processing based on a pupil-corneal reflection method is executed. Through the pupil-corneal reflection method, the user's line-of-sight is detected by calculating a line-of-sight vector which represents a direction (rotating angle) of the eyeball based on an image of the pupil included in the captured image of the eyeball and the Purkinje image.

The display apparatus according to the exemplary embodiment of the present disclosure may include an image capturing apparatus having a light receiving element, and control a display image displayed by the display apparatus based on the information about the user's line-of-sight acquired from the image capturing apparatus.

Specifically, the display apparatus determines, based on the line-of-sight information, a first line-of-sight area which the user is gazing at and a second line-of-sight area other than the first line-of-sight area. The first and the second line-of-sight areas may be determined by the control apparatus included in the display apparatus, or the first and the second line-of-sight areas determined by an external control apparatus may be received. In the display area of the display apparatus, a display resolution of the first line-of-sight area may be controlled to be higher than a display resolution of the second line-of-sight area. In other words, the resolution of the second line-of-sight area may be lower than that of the first line-of-sight area.

The display area has a first display area and a second display area different from the first display area. Based on the line-of-sight information, an area having a high priority is determined from the first and the second display areas.

The first and the second display areas may be determined by the control apparatus included in the display apparatus, or the first and the second display areas determined by an external control apparatus may be received. A resolution of the area having a high priority may be controlled to be higher than a resolution of the area other than the area having the high priority. In other words, a resolution of the area having a relatively low priority may be lowered.

The first line-of-sight area and the area having a high priority may be determined by an artificial intelligence (AI) program. The AI program may be a model configured to estimate an angle of a line-of-sight and a distance to an object to which the line-of-sight is directed from an image of the eyeball by using the image of the eyeball and the actual line-of-sight direction of the eyeball captured in the image as the training data. The AI program may be included in the display apparatus or the image capturing apparatus, or may be included in the external apparatus. In a case where the AI program is included in the external apparatus, the information is transmitted to the display apparatus through communication.

In a case where display control is executed based on visual detection, the display apparatus can favorably be applied to the smart-glasses further including an image capturing apparatus for capturing the outside image. The smart-glasses can display information about the outside image captured thereby in real time.

Figure 21A:
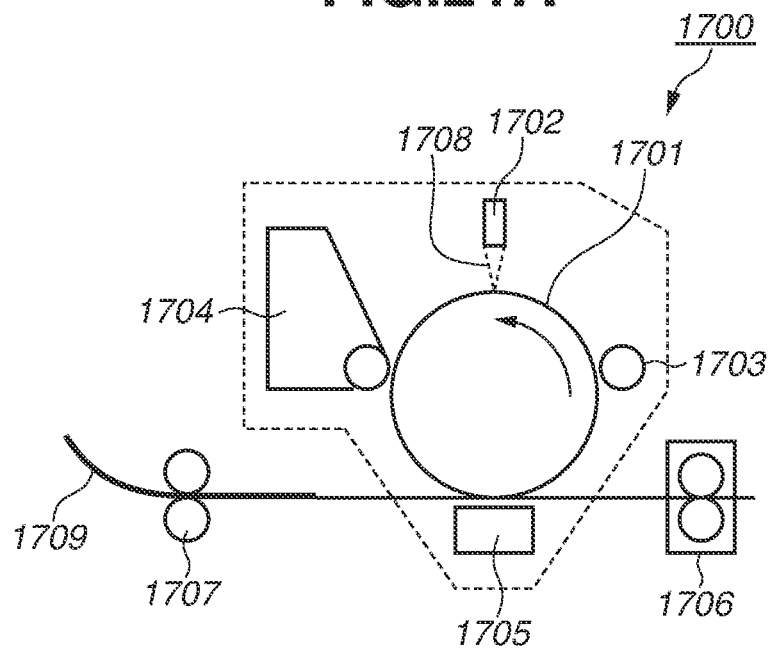
FIG. 21A is a schematic diagram illustrating an example of an image forming apparatus.

FIG. 21A is a schematic diagram illustrating an example of an image forming apparatus according to the present exemplary embodiment. An image forming apparatus 1700 is an electrophotographic image forming apparatus including a photosensitive body 1701, an exposure light source 1702, a charging unit 1703, a development unit 1704, a transfer unit 1705, a conveyance roller 1706, and a fixing unit 1707. Light 1708 is emitted from the exposure light source 1702, so that an electrostatic latent image is formed on a surface of the photosensitive body 1701. This exposure light source 1702 includes an organic light emitting element according to the present exemplary embodiment. The development unit 1704 includes toner. The charging unit 1703 electrically charges the photosensitive body 1701.

The transfer unit 1705 transfers a developed image on a recording medium 1709. The conveyance roller 1706 conveys the recording medium 1709. For example, the recording medium 1709 is paper. The fixing unit 1707 fixes an image formed on the recording medium 1709.

Figure 21B:
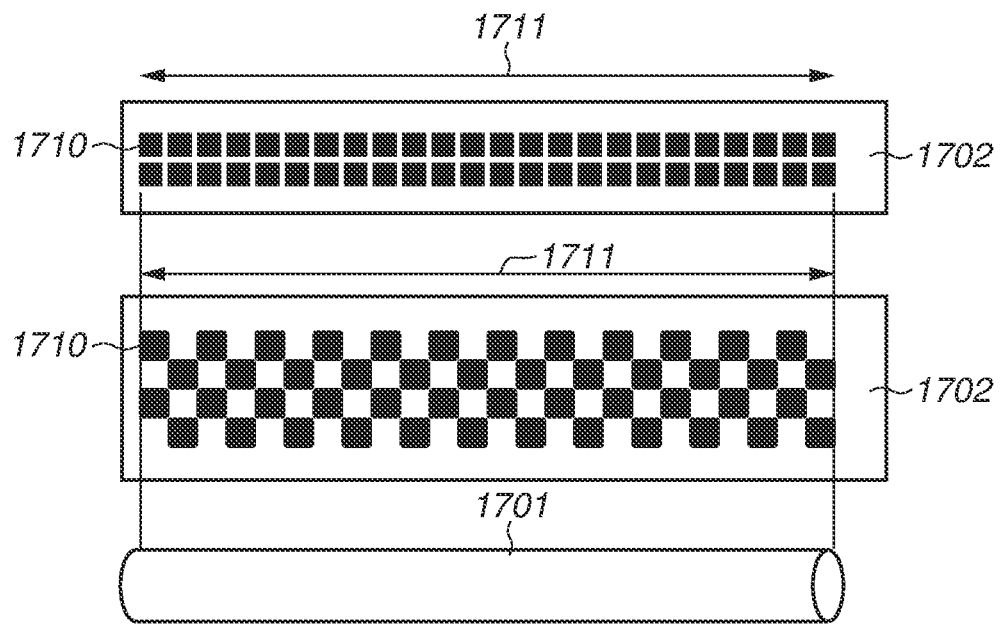
FIG. 21B illustrates schematic diagrams of examples of an exposure light source of the image forming apparatus.

FIG. 21B illustrates 2 configurations of the exposure light source 1702 and a plurality of light emitting units 1710 arranged on a long substrate. Each of the light emitting units 1710 includes the organic light emitting element according to the above-described exemplary embodiment. A column direction which the organic light emitting elements are arranged in an array is indicated by an arrow 1711. The column direction is a direction same as a rotation axis direction of the photosensitive body 1701. This direction can also be called "long axis direction". In the upper part of FIG. 21B, a configuration is illustrated in which the light emitting units 1710 are arranged in a long axis direction of the photosensitive body 1701. In the lower part of FIG. 21B, a configuration different from the upper part of FIG. 21B is illustrated. In this configuration, the light emitting units 1710 are alternately arranged in each of the first and the second columns in the column direction. The light emitting units 1710 are arranged in the first and the second columns, at positions different in a raw direction. The light emitting units 1710 are arranged in the first column with spaces therebetween.

The second column has the light emitting units 1710 arranged at positions corresponding the spaces between the light emitting units 1710 in the first column. In other words, the light emitting units 1710 are also arranged in the raw direction with spaces therebetween. For example, the array illustrated in the lower part of FIG. 21B can be described as an array in which the light emitting units 1710 are arranged in "a grid-like state", "a houndstooth check pattern", or "a checker board pattern".

According to the present disclosure, it is possible to provide an organic light emitting element configured to suppress current leakage occurring in a positive electrode and a negative electrode.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-165613, filed Oct. 7, 2021, which is hereby incorporated by reference herein in its entirety.

What is claimed is:

1. An organic light emitting element comprising:
   a reflection layer;
   an insulation layer;
   a first electrode;
   a light emitting layer; and
   a second electrode, arranged in this order from a side of a substrate,
   wherein the reflection layer includes a first portion having a first thickness and a second portion having a second thickness smaller than the first thickness,
   wherein the reflection layer includes a first layer consisting of a first material and a second layer consisting of a second material different from the first material, arranged in this order from a side of the substrate,
   wherein the first portion is a portion where the second layer is arranged between the first layer and the insulation layer,
   wherein the second portion is a portion where the second layer is not arranged between the first layer and the insulation layer,
   wherein the first electrode overlaps with the second portion in a planar view with respect to the substrate, and
   wherein at least part of an edge of the first electrode overlaps with the second portion in the planar view.

2. The organic light emitting element according to claim 1,
   wherein the second layer is an upper surface of the first portion of the reflection layer, and
   wherein the first layer is an upper surface of the second portion of the reflection layer.

3. The organic light emitting element according to claim 1, wherein a thickness of the first layer at the first portion is greater than a thickness of the first layer at the second portion.

4. The organic light emitting element according to claim 1, wherein the first portion surrounds the second portion in the planar view.

5. The organic light emitting element according to claim 1,
   wherein the first material contains aluminum, and
   wherein the second material is selected from the group consisting of nitride, oxide, and oxynitride.

6. The organic light emitting element according to claim 1, wherein part of the first electrode overlaps with the first portion in the planar view.

7. The organic light emitting element according to claim 1, wherein, when a wavelength of light having intensity the highest from among intensity of light emitted from the light emitting layer is a first wavelength, reflectance of the light of the first wavelength at the first portion is lower than reflectance of the light of the first wavelength at the second portion.

8. The organic light emitting element according to claim 1, further comprising a conductive member electrically separated from the reflection layer, arranged on a layer same as the reflection layer,
wherein the first electrode includes an extending portion extending to and overlapping with the conductive member in the planar view with respect to the substrate, and
wherein the extending portion and the conductive member are electrically connected to each other.

9. The organic light emitting element according to claim 1, further comprising a second insulation layer which covers at least part of an end portion of the first electrode,
wherein a groove is arranged on an upper surface of the second insulation layer, and
wherein the groove is arranged between the first electrode and the first portion in the planar view with respect to the substrate.

10. A display apparatus comprising:
the organic light emitting element according to claim 1; and
a transistor connected to the organic light emitting element.

11. A photoelectric conversion apparatus comprising:
an optical unit including a plurality of lenses;
an image sensor configured to receive light passing through the optical unit; and
a display unit configured to display an image captured by the image sensor,
wherein the display unit includes the organic light emitting element according to claim 1.

12. An electronic device comprising:
a display unit including the organic light emitting element according to claim 1;
a housing on which the display unit is mounted; and
a communication unit mounted on the housing, configured to communicate with an outside.

13. An illumination apparatus comprising:
a light source including the organic light emitting element according to claim 1; and
a light diffusion unit or an optical filter configured to transmit light emitted from the light source.

14. A moving body comprising:
a lamp unit including the organic light emitting element according to claim 1; and
a body on which the lamp unit is mounted.

15. An exposure light source of an electrophotographic image forming apparatus comprising the organic light emitting element according to claim 1.

16. An organic light emitting element comprising:
a reflection layer;
a first electrode;
a second insulation layer covering at least part of an end portion of the first electrode;
a light emitting layer; and
a second electrode, arranged in this order from a side of a substrate,
wherein the reflection layer includes a first portion having a first thickness and a second portion having a second thickness smaller than the first thickness,
wherein the first electrode overlaps with the second portion in a planar view with respect to the substrate,
wherein a groove is arranged on an upper surface of the second insulation layer, and
wherein the groove is arranged between the first electrode and the first portion in the planar view with respect to the substrate.

* * * * *